(12) United States Patent
Tagawa et al.

(10) Patent No.: US 10,818,260 B2
(45) Date of Patent: Oct. 27, 2020

(54) SCAN SIGNAL LINE DRIVING CIRCUIT AND DISPLAY DEVICE INCLUDING SAME

(71) Applicant: SHARP KABUSHIKI KAISHA, Sakai, Osaka (JP)

(72) Inventors: Akira Tagawa, Sakai (JP); Takuya Watanabe, Sakai (JP); Yasuaki Iwase, Sakai (JP); Takatsugu Kusumi, Sakai (JP); Yohei Takeuchi, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 3 days.

(21) Appl. No.: 16/191,226

(22) Filed: Nov. 14, 2018

(65) Prior Publication Data
US 2019/0147821 A1    May 16, 2019

(30) Foreign Application Priority Data

Nov. 15, 2017 (JP) .................................. 2017-219625

(51) Int. Cl.
*G09G 3/36* (2006.01)
*G11C 19/28* (2006.01)
*G06F 3/041* (2006.01)

(52) U.S. Cl.
CPC ......... *G09G 3/3677* (2013.01); *G06F 3/0412* (2013.01); *G06F 3/0416* (2013.01); *G11C 19/28* (2013.01); *G09G 2310/0286* (2013.01)

(58) Field of Classification Search
CPC ...... G06F 3/0412; G06F 3/0416; G06F 3/044; G09G 3/3677; G09G 2310/0286; G09G 3/20; G09G 3/3696; G09G 2310/0267; G09G 2300/0842; G11C 19/28
See application file for complete search history.

(56) References Cited

U.S. PATENT DOCUMENTS

| | | | |
|---|---|---|---|
| 7,492,853 B2* | 2/2009 | Tobita | G11C 19/28 377/64 |
| 2002/0003964 A1 | 1/2002 | Kanbara et al. | |
| 2013/0241814 A1* | 9/2013 | Hirabayashi | G09G 3/3677 345/100 |
| 2014/0232703 A1* | 8/2014 | Tatara | G09G 3/3233 345/204 |
| 2014/0267156 A1* | 9/2014 | Koga | G06F 3/044 345/174 |

(Continued)

FOREIGN PATENT DOCUMENTS

| | | |
|---|---|---|
| JP | H09-064375 A | 3/1997 |
| JP | 2002-055644 A | 2/2002 |

(Continued)

*Primary Examiner* — Christopher E Leiby
(74) *Attorney, Agent, or Firm* — ScienBiziP, P.C.

(57) ABSTRACT

Each unit circuit includes a thin film transistor (first stabilization transistor) having a gate terminal to which a clear signal which goes to an on level when a frame period ends applied, a drain terminal connected to a charge holding node, and a source terminal to which a potential of an off level is applied. Here, a gate length of the thin film transistor is set to be larger than gate lengths of other charge holding node turn-off transistors. Alternatively, a multi-gate structure is adopted for the thin film transistor and a single gate structure is adopted for the other charge holding node turn-off transistors.

6 Claims, 31 Drawing Sheets

(56) References Cited

U.S. PATENT DOCUMENTS

| | | | |
|---|---|---|---|
| 2015/0268777 A1* | 9/2015 | Okamura | G06F 3/0412 345/205 |
| 2015/0370371 A1* | 12/2015 | Azumi | G06F 3/044 345/174 |
| 2016/0188076 A1* | 6/2016 | Hao | G06F 3/0416 345/173 |
| 2017/0090630 A1* | 3/2017 | Kim | G09G 3/2096 |
| 2017/0123556 A1* | 5/2017 | Lin | G06F 3/0412 |
| 2018/0004321 A1* | 1/2018 | Kuroiwa | G06F 3/044 |
| 2018/0095576 A1* | 4/2018 | Yokoo | G02F 1/13338 |
| 2018/0113501 A1* | 4/2018 | Iwaki | G02F 1/13338 |
| 2018/0335884 A1* | 11/2018 | Zhang | G09G 3/3266 |
| 2019/0114013 A1* | 4/2019 | Wu | G06F 3/0412 |
| 2019/0139508 A1* | 5/2019 | Park | G06F 3/0412 |

FOREIGN PATENT DOCUMENTS

| | | |
|---|---|---|
| JP | 2008-140489 A | 6/2008 |
| JP | 2008-140490 A | 6/2008 |
| JP | 2014-164327 A | 9/2014 |

* cited by examiner

GATE LENGTH OF THIN FILM TRANSISTOR T6
> GATE LENGTHS OF OTHER CHARGE
HOLDING NODE TURN-OFF TRANSISTORS

SCAN SIGNAL LINE DRIVING CIRCUIT AND DISPLAY DEVICE INCLUDING SAME

BACKGROUND

1. Field

The present disclosure relates to a scan signal line driving circuit that drives a gate bus line (scan signal line) provided in a display unit of a display device, and particularly to a scan signal line driving circuit which is provided in a display device including a touch panel.

2. Description of the Related Art

In the related art, an active matrix type liquid crystal display device including a display unit that includes a plurality of source bus lines (video signal lines) and a plurality of gate bus lines (scan signal lines) is known. In the liquid crystal display device in the related art, a gate driver (scan signal line driving circuit) for driving the gate bus lines is often mounted in a peripheral portion of a substrate configuring a liquid crystal panel as an integrated circuit (IC) chip. However, recently, in order to decrease a frame size, a structure is used gradually and increasingly in which a gate driver is directly formed on a TFT substrate which is one of two glass substrates configuring the liquid crystal panel. The gate driver is called a "monolithic gate driver".

The display unit of the active matrix type liquid crystal display device includes a plurality of source bus lines, a plurality of gate bus lines, and a plurality of pixel formation portions correspondingly provided to intersections of the plurality of source bus lines with the plurality of gate bus lines. The plurality of pixel formation portions are arranged in a matrix to configure a pixel array. Each pixel formation portion includes a thin film transistor which is a switching element in which a gate terminal is connected to a gate bus line passing through a corresponding intersection and a source terminal is connected to a source bus line passing through the intersection, a pixel capacitance for holding a pixel voltage value, and the like. The active matrix type liquid crystal display device also includes the aforementioned gate driver and a source driver (video signal line driving circuit) for driving the source bus line.

A video signal indicating the pixel voltage value is transmitted by the source bus line. However, each source bus line is not able to temporarily (simultaneously) transmit the video signals indicating pixel voltage values for a plurality of rows. Accordingly, writing (charging) of the video signals to the pixel capacitances in the above-described pixel formation portions arranged in a matrix is successively performed row by row. Therefore, the gate driver is configured by a shift register configured by a plurality of stages such that the plurality of gate bus lines are sequentially selected for each predetermined period. Active scan signals are sequentially output from each stage of the shift register, and thereby, writing of the video signals to the pixel capacitances is successively performed row by row as described above.

In the present specification, a circuit configuring each stage (repeating unit) of the shift register is referred to as a "unit circuit". Successively selecting the gate bus line in the first row to the gate bus line in the last row one by one is simply referred to as "scanning", and during scanning from the first row to the last row, halting the scanning halfway is called a "halfway halt of scanning". A period during which the scanning is halted is referred to as an "idle period".

FIG. 34 is a circuit diagram illustrating a configuration example of a unit circuit of a related art in a shift register configuring a monolithic gate driver. As understood from FIG. 34, the unit circuit is configured with a capacitor and a plurality of thin film transistors. In the unit circuit illustrated in FIG. 34, if a set signal S changes from a low level to a high level, a potential of a node N1 increases due to precharge (a desired amount of charges is held in the node N1). If an input clock signal CKin changes from the low level to the high level in a state where the node N1 is precharged as described above, the potential of the node N1 increases greatly, and an output signal (scan signal) G goes to the nigh level. Thereby, a gate bus line connected to the unit circuit is selected. As the above-described operation is successively performed from the first stage to the last stage of the shift register, a plurality of gate bus lines provided in the display unit are sequentially selected for each predetermined period. In the present specification, a node for holding charges so as to output a high-level (on level) scan signal to the gate bus line connected to the unit circuit as in the above-described node N1 is referred to as a "charge holding node". A node for controlling a potential of a charge holding node, like a node N2 in FIG. 34, is referred to as a "stabilization node".

In a case where a threshold voltage of the thin film transistor in the unit circuit is low, a leakage current (off leak) generated when the thin film transistor is in an off state may increase. If such a leakage current increases, an operation of the gate driver becomes unstable and an abnormal operation is caused.

Therefore, Japanese Unexamined Patent Application Publication No. 2008-140489 states that a dual gate structure is adopted for some of transistors among a plurality of transistors configuring a unit circuit so as to prohibit a shift register from malfunctioning due to an off leakage. Contents relating to a stabilization of an operation of the shift register are also described in, for example, Japanese Unexamined Patent Application Publication No. 2008-140490, Japanese Unexamined Patent Application Publication No. 2002-55644, and Japanese Unexamined Patent Application Publication No. 9-64375. A display device including a touch panel is described in, for example, Japanese Unexamined Patent Application Publication No. 2014-164327.

Recently, a display device such as liquid crystal display device often installs a touch panel function for detecting a position touched by a finger, a pen, or the like. With respect to this, an out-cell type touch panel is often used in the related art, but recently, a full in-cell type touch panel in which a common electrode is used as an electrode for detecting the touched position is actively developed. In the liquid crystal display device having the full in-cell type touch panel, the common electrode is used as an electrode for detecting touched position as described above, and thus, touched position detecting processing has to be performed when the gate bus line is not scanned. Accordingly, in order to ensure an adequate response performance, the aforementioned idle period that is a period for detecting touched position may be provided plural times in one frame period (one vertical scan period) as illustrated in FIG. 35. That is, halting and restarting the scanning may be repeated plural times in one frame period. FIG. 35 successively illustrates a state where the scanning is sequentially performed from a gate bus line GL(1) in the first row to a gate bus line GL(i) in the ith row (the last row) with thick solid lines.

With respect to the scanning of the gate bus lines, in a case where the scanning is halted halfway after the scanning to the gate bus line in a certain row is completed, the scanning has to restart from a gate bus line in a next row of the certain row after the idle period ends. Accordingly, in a case where a monolithic gate driver is adopted, a potential of the charge holding node has to be held in the idle period (that is, the precharged state has to be maintained), in the unit circuit corresponding to the restart position of the scanning and a position near the restart position. A length of the idle period is generally set to 100 microseconds to 600 microseconds, and a large off leakage may occur in the thin film transistor connected to the charge retention node in the idle period. In this case, the potential of the charge holding node decreases in the idle period, and restarting of the scanning is not normally performed.

In the shift register disclosed in Japanese Unexamined Patent Application Publication No. 2008-140489, in order to prohibit the shift register from malfunctioning due to the off leakage, a plurality of thin film transistors connected to the charge holding node are configured as a dual gate structure. However, with the configuration, a circuit area of the respective unit circuits increase, and thereby, a frame size increases. Japanese Unexamined Patent Application Publication No. 2008-140489 does not describe anything on halting and restarting the scanning.

It is desirable to realize a gate driver (gate driver for a display device including a touch panel) capable of halting scanning halfway while suppressing an increase in frame size.

SUMMARY

According to an aspect of the disclosure, there is provided a scan signal line driving circuit for driving a plurality of scan signal lines that are arranged on a display unit of a display device including a touch panel. The scan signal line driving circuit includes a shift register that operates in response to a plurality of clock signals and includes a plurality of unit circuits, each including a plurality of transistors and being connected to a corresponding scan signal line. Clock operations of the plurality of clock signals are halted during an idle period that is provided in a frame period so as to detect a touched position on the touch panel. Each unit circuit includes a charge holding node that holds charges to output a scan signal of an on level to the corresponding scan signal line; an output control transistor having a gate terminal that is connected to the charge holding node and a source terminal that is connected to the corresponding scan signal line; and a plurality of charge holding node turn-off transistors that change a potential of the charge holding node towards an off level, in response to a potential of a gate terminal. The plurality of charge holding node turn-off transistors include a first stabilization transistor having a gate terminal to which a clear signal that goes to an on level at a time of an end of the frame period is applied, a drain terminal that is connected to the charge holding node, and a source terminal to which a potential of an off level is applied. A gate length of the first stabilization transistor is larger than gate lengths of transistors other than the first stabilization transistor among the plurality of charge holding node turn-off transistors that are included in each unit circuit.

According to another aspect of the disclosure, there is provided a scan signal line driving circuit for driving a plurality of scan signal lines that are arranged on a display unit of a display device including a touch panel. The scan signal line driving circuit includes a shift register that operates in response to a plurality of clock signals and includes a plurality of unit circuits, each including a plurality of transistors and being connected to a corresponding scan signal line. Clock operations of the plurality of clock signals are halted during an idle period that is provided in a frame period so as to detect a touched position on the touch panel. Each unit circuit includes a charge holding node that holds charges to output a scan signal of an on level to the corresponding scan signal line; an output control transistor having a gate terminal that is connected to the charge holding node and a source terminal that is connected to the corresponding scan signal line; and a plurality of charge holding node turn-off transistors that change a potential of the charge holding node towards an off level, in response to a potential of a gate terminal. The plurality of charge holding node turn-off transistors include a first stabilization transistor having a gate terminal to which a clear signal that goes to an on level at a time of an end of the frame period is applied, a drain terminal that is connected to the charge holding node, and a source terminal to which a potential of an off level is applied. In each unit circuit, the first stabilization transistor has a multi-gate structure, and transistors other than the first stabilization transistor among the plurality of charge holding node turn-off transistors have a single gate structure.

DESCRIPTION OF THE EMBODIMENTS

Hereinafter, embodiments will be described. In the following description, an example in which an n-channel type thin film transistor is adopted will be described. Either a drain or a source having the higher potential is called a drain in the n-channel transistor, however, in the description of the present specification, one is defined as the drain and the other is defined as the source, and thereby, a source potential is sometimes higher than a drain potential.

0. Functional Configuration of Display Device

Figure 2:
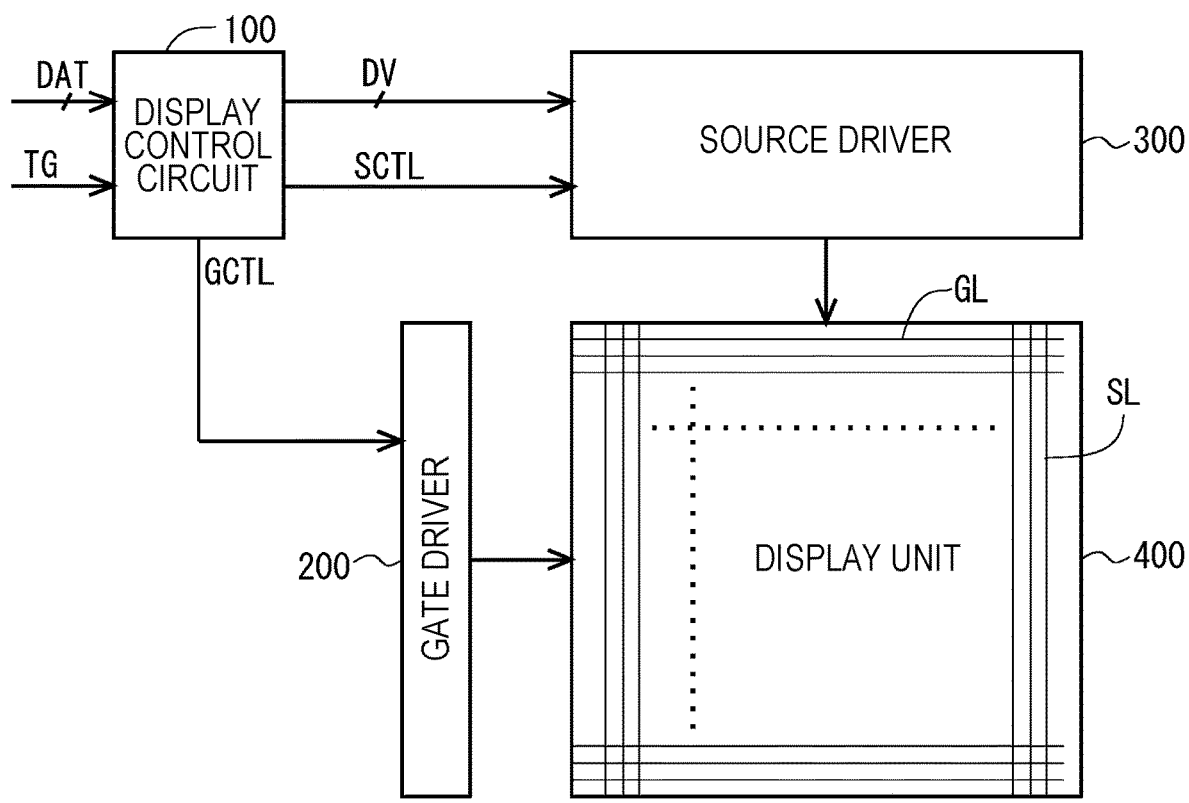
FIG. 2 is a block diagram illustrating a functional configuration of a liquid crystal display device in all the embodiments.

First, matters common to all embodiments will be described. FIG. 2 is a block diagram illustrating a functional configuration of a liquid crystal display device in all the embodiments. Since FIG. 2 is a diagram illustrating the functional configuration, a positional relationship or the like between the configuration elements is different from the actual elements. As illustrated in FIG. 2, the liquid crystal display device includes a display control circuit 100, a gate driver 200, a source driver 300, and a display unit 400.

The gate driver 200 and the display unit 400 are formed on the same substrate (a TFT substrate which is one of two substrates configuring a liquid crystal panel). That is, the gate driver 200 is a monolithic gate driver. In all the embodiments, it is assumed that the liquid crystal panel configuring the display unit 400 is integrated with a touch panel. That is, the liquid crystal display device in all the embodiments includes a full in-cell type touch panel. Description of a configuration of the touch panel is omitted because it is possible to adopt a known configuration to the configuration of the touch panel.

Figure 3:
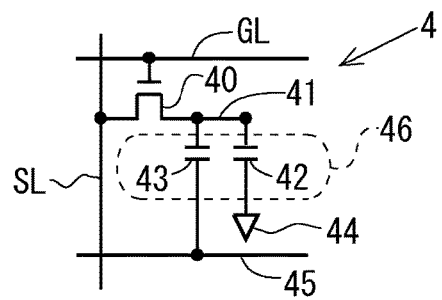
FIG. 3 is a circuit diagram illustrating a configuration of a pixel formation unit in all the embodiments.

Referring to FIG. 2, a plurality of source bus lines (video signal lines) SL and a plurality of gate bus lines (scan signal lines) GL are disposed in the display unit 400. A pixel formation unit for forming a pixel is configured at an intersection of a source bus line SL with a gate bus line GL in the display unit 400. FIG. 3 is a circuit diagram illustrating a configuration of one pixel formation unit 4. The pixel formation unit 4 includes a pixel thin film transistor (TFT) 40 which is a switching element having a gate terminal connected to a gate bus line GL passing through a corresponding intersection and a source terminal connected to a source bus line SL passing through the intersection, a pixel electrode 41 connected to a drain terminal of the pixel TFT 40, a common electrode 44 and an auxiliary capacitance electrode 45 commonly provided for a plurality of the pixel formation unit 4 formed in the display unit 400, a liquid crystal capacitance 42 formed by the pixel electrode 41 and the common electrode 44, and an auxiliary capacitance 43 formed by the pixel electrode 41 and the auxiliary capacitance electrode 45. A pixel capacitance 46 is configured by the liquid crystal capacitance 42 and the auxiliary capacitance 43. A configuration of the pixel formation unit 4 is not limited to the configuration illustrated in FIG. 3, and for example, a configuration without the auxiliary capacitance 43 and the auxiliary capacitance electrode 45 may also be adopted. The common electrode 44 is also used as an electrode for detecting a touched position. In a case where the common electrode 44 is also used as an electrode for detecting the touched position, the common electrode 44 is divided into a plurality of electrodes, that is, in segments.

A thin film transistor (a-Si TFT) in which amorphous silicon is used for a semiconductor layer, a thin film transistor in which microcrystalline silicon is used for a semiconductor layer, a thin film transistor (oxide TFT) in which an oxide semiconductor is used for a semiconductor layer, a thin film transistor (LTPS-TFT) in which low-temperature polysilicon is used for a semiconductor layer, or the like may be adopted as the pixel TFT 40. For example, a thin film transistor having an oxide semiconductor layer containing an In—Ga—Zn—O-based semiconductor (for example, indium, gallium, zinc oxide) may be adopted as the oxide TFT. These points are applied to the thin film transistor in the gate driver 200 in the same manner as above. It is possible to reduce off-leakage by adopting the oxide TFT.

Hereinafter, an operation of the configuration elements illustrated in FIG. 2 will be described. The display control circuit 100 receives an image signal DAT sent from the outside and a timing signal group TG such as a horizontal synchronization signal and a vertical synchronization signal, and outputs a digital video signal DV, a gate control signal GCTL for controlling an operation of the gate driver 200, and a source control signal SCTL for controlling an operation of the source driver 300. The gate control signal GCTL includes a gate start pulse signal, a gate clock signal, and the like. The source control signal SCTL includes a source start pulse signal, a source clock signal, and a latch strobe signal.

The gate driver 200 repeats application of an active scan signal to each gate bus line GL by assuming one vertical scan period as a cycle in response to the gate control signal GCTL sent from the display control circuit 100. That is, the gate driver 200 scans the gate bus line GL. When touched position detection processing is performed, the scan is halted halfway.

The source driver 300 applies a video signal for drive to the source bus line SL in response to the digital video signal DV and the source control signal SCTL sent from the display control circuit 100. At this time, the source driver 300 successively holds the digital video signals DV indicating voltages to be applied to the respective source bus lines SL at the timing when pulses of the source clock signal are generated. At the timing when pulses of the latch strobe signal are generated, the held digital video signals DV are converted into analog voltages. The converted analog voltages are simultaneously applied to all the source bus lines SL as the video signals for drive, As described above, as the scan signal is applied to the gate bus line GL and the video signal for drive is applied to the source bus line SL, an image corresponding to the image signal DAT sent from the outside is displayed on the display unit 400.

The configuration, of the gate driver 200 of the configuration elements illustrated in FIG. 2 is different for each embodiment. Therefore, hereinafter, a detailed configuration, an operation, and the like of the gate driver 200 will be described for each embodiment.

1. First Embodiment

1.1 Schematic Configuration of Gate Driver

Figure 4:
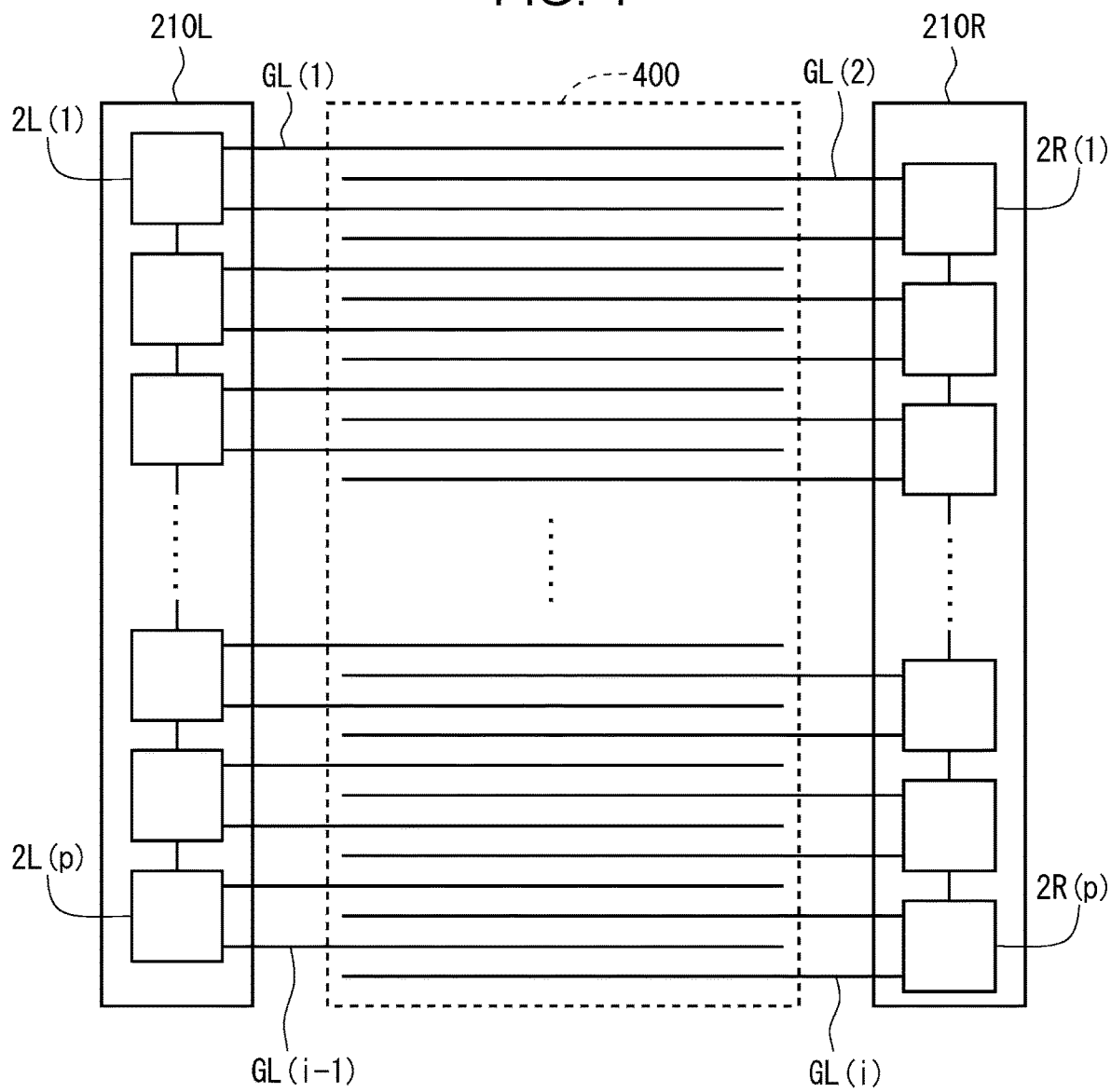
FIG. 4 is a block diagram illustrating a schematic configuration of a gate driver, in a first embodiment.

FIG. 4 is a block diagram illustrating a schematic configuration of the gate driver 200 according to the present embodiment. The gate driver 200 according to the present embodiment is configured with a shift register 210L disposed on one end side (left side in FIG. 4) of the display unit 400 and a shift register 210R disposed on the other end side (right side in FIG. 4) of the display unit 400. In the display unit 400, i gate bus lines GL(1) to GL(i) are arranged, the shift register 210L drives the gate bus lines GL in the odd-numbered rows, and the shift register 210R drives the gate bus line GL in the even-numbered rows. That is, in the present embodiment, the gate bus lines GL(1) to GL(i) are driven by using a drive method called a "comb drive" or an "interlace drive".

The shift register 210L is configured with p unit circuits 2L(1) to 2L(p), and the shift register 210R is configured with p unit circuits 2R(1) to 2R(p). Symbol p denotes i/4. In FIG. 4, a unit circuit in the shift register 210L is denoted by a code beginning with "2L", and a unit circuit in the shift register 210R is denoted by a code beginning with "2R", and in the following description, when referring to a specific unit circuit, a reference numeral 2 is simply attached to the unit circuit.

As can be seen from FIG. 4, in the present embodiment, each unit circuit 2 is connected to two gate bus lines GL. In more detail, if q is an integer larger than or equal to 1 and smaller than or equal to p, the unit circuit 2L(q) in the shift register 210L is connected to the gate bus line GL(4q−3) and the gate bus line GL(4q−1), and the unit circuit 2R(q) in the shift register 210R is connected to the gate bus line GL(4q−2) and the gate bus line GL(4q).

1.2 Configuration of Shift Register

Figure 5:
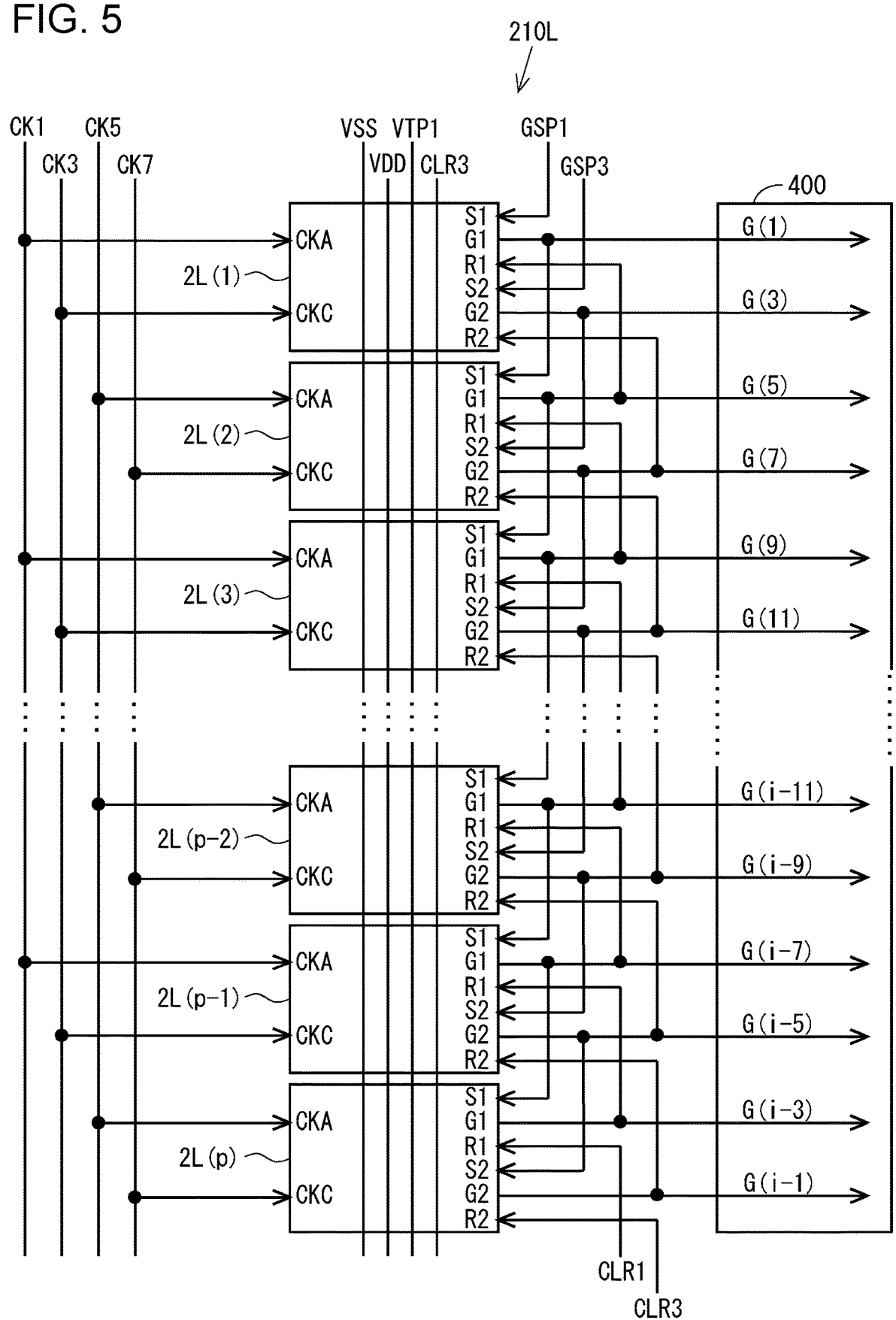
FIG. 5 is a block diagram illustrating a configuration of a shift register disposed on one end side of a display unit, in the first embodiment.
Figure 6:
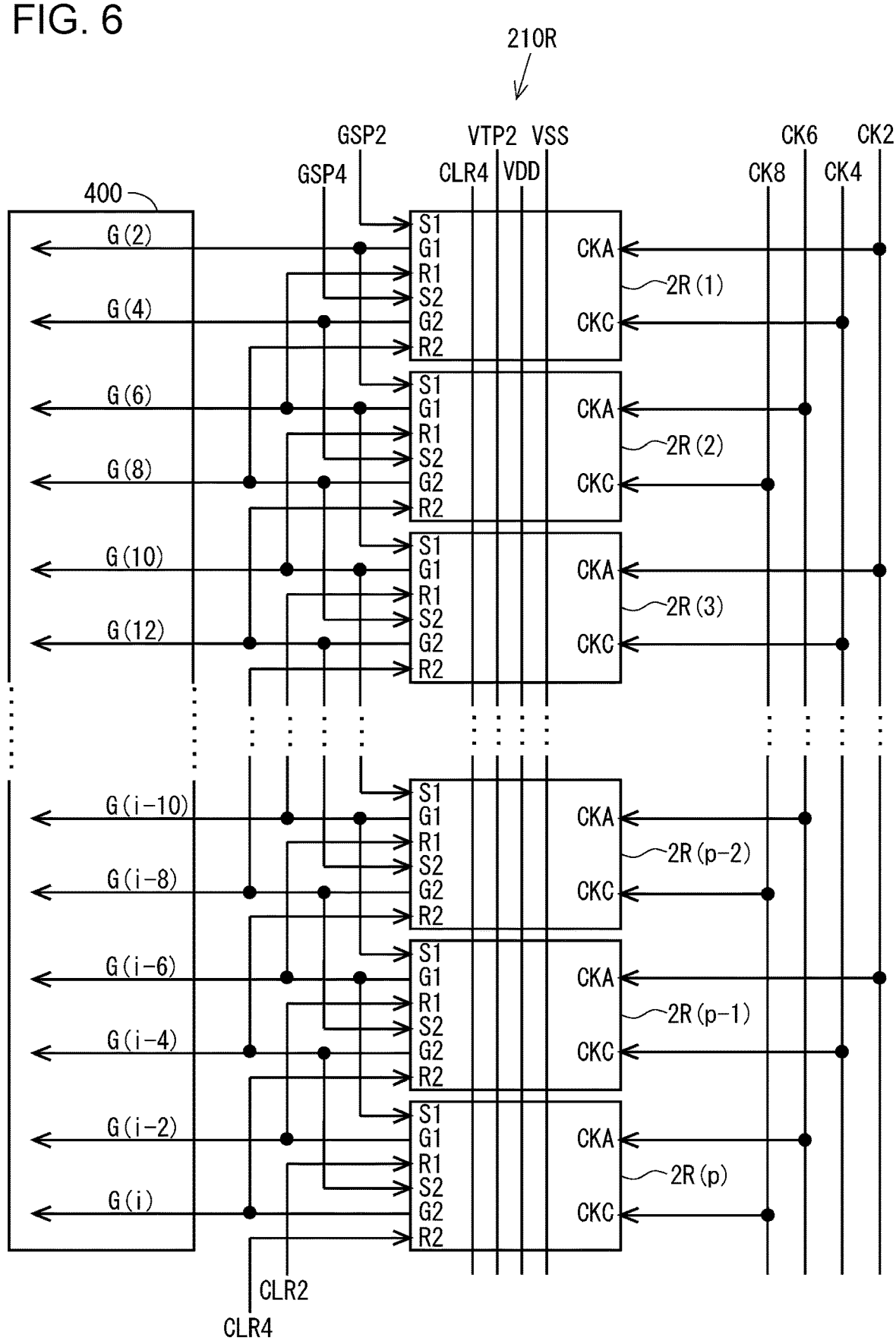
FIG. 6 is a block diagram illustrating a configuration of another shift register disposed on the other end side of the display unit, in the first embodiment.

FIG. 5 is a block diagram illustrating a configuration of the shift register 210L, FIG. 6 is a block diagram illustrating a configuration of the shift register 210R. As described above, the shift register 210L is configured with p unit circuits 2L(1) to 2L(p), and the shift register 210R is configured with p unit circuits 2R(1) to 2R(p).

Gate start pulse signals GSP1 and GSP3, clear-signals CLR1 and CLR3, gate clock signals CK1, CK3, CK5, and CK7, and a control signal VTP1 are applied to the shift register 210L as the gate control signal GCTL. Gate start pulse signals GSP2 and GSP4, clear signals CLR2 and CLR4, gate clock signals CK2, CK4, CK6, and CK8, and a control signal VTP2 are applied to the shift register 210R as the gate control signal GCTL. A high-level DC power supply voltage VDD and a low-level DC power supply voltage VSS are also applied to the shift registers 210L and 210R. The gate clock signals CK1 to CK8 are eight-phase clock signals. As can be seen from FIGS. 5 and 6, the shift register 210L and the shift register 210R have the same configuration, and thus, only the configuration of the shift register 210L will be described below, Ana the configuration of the shift register 210R will be omitted.

In the shift register 210L, signals applied to the respective unit circuits 2 are as follows (see FIG. 5). If o is an odd number and e is an even number, the gate clock signal CK1 is applied to the unit circuit 2L(o) as an input clock signal CKA and a gate clock signal CK3 is applied to the unit circuit 2L(o) as an input clock signal CKC, the gate clock signal CK5 is applied to the unit circuit 2L(e) as the input clock signal CKA, and the gate clock signal CK7 is applied to the unit circuit 2L(e) as the input clock signal CKC. An output signal G1 output from the unit circuit 2L(q−1) is applied to the unit circuit 2L(q) of a certain stage (here, assumed to be a qth stage) as a set signal S1, an output signal G2 output from the unit circuit 2L(q−1) is applied to a certain stage as a set signal S2, an output signal G1 output from the unit circuit 2L(q+1) is applied to the certain stage as a reset signal R1, and an output signal G2 output from the unit circuit 2L(q+1) is applied to the certain stage as a reset signal R2. The gate start pulse signal GSP1 is applied to the unit circuit 2L(1) as the set signal S1, the gate start pulse signal GSP3 is applied to the unit circuit 2L(1) as the set signal S2, the clear signal CLR1 is applied to the unit circuit 2L(p) as the reset signal R1, and the clear signal CLR3 is applied to the unit circuit 2L(p) as the reset signal R2. The DC power supply voltage VSS, the DC power supply voltage VDD, the control signal VTP1, and the clear signal CLR3 are commonly applied to all the unit circuits 2. The control signal VTP1 goes to a high level only during an idle period and the clear signal CLR3 goes to a high level after scanning of all the gate bus lines GL ends. The potentials on a low level side of the clear signals CLR1 and CLR3 and the control signal VTP1 are made equal to a potential based on the DC power supply voltage VSS.

The output signals G1 and G2 are output from the respective unit circuits 2 of the shift register 210L. The output signal G1 output from the unit circuit 2L(q) of a certain stage (here, assumed to be a qth stage) is applied to the gate bus line GL(4q−3) as the scan signal G(4q−3), is also applied to the unit circuit 2L(q−1) as the reset signal R1, and is also applied to the unit circuit 2L(q+1) as the set signal S1. The output signal G2 output from the unit circuit 2L(q) of the certain stage is applied to the gate bus line GL(4q−1) as the scan signal G(4q−1), is also applied to the unit circuit 2L(q−1) as the reset signal R2, and is also applied to the unit circuit 2L(q+1) as the set-signal S2. However, the output signals G1 and G2 output from the unit circuit 2L(1) are not applied to the unit circuit as reset signal, and the output signals G1 and G2 output from the unit circuit 2L(p) is not applied to another unit circuit as the set signal.

Two gate start pulse signals GSP1 and GSP3 are applied to the shift register 210L, but only one gate start pulse signal may be applied to the shift register 210L. In this case, since only the unit circuit 2L(1) in a first stage has a different operation state from the other unit circuits, it is preferable that the output signals G1 and G2 output from the unit circuit 2L(1) in the first stage are set to be dummy outputs.

Two clear signals CLR1 and CLR3 are applied to the shift register 210L, but only one clear signal may be applied to the shift register 210L. In this case, since only the unit circuit 2L(p) in the pth stage has a different operation state from the other unit circuits, it is preferable that the output signals G1 and G2 output from the unit circuit 2L(p) in the pth stage are set to be dummy outputs.

1.3 Configuration of Unit Circuit

Figure 7:
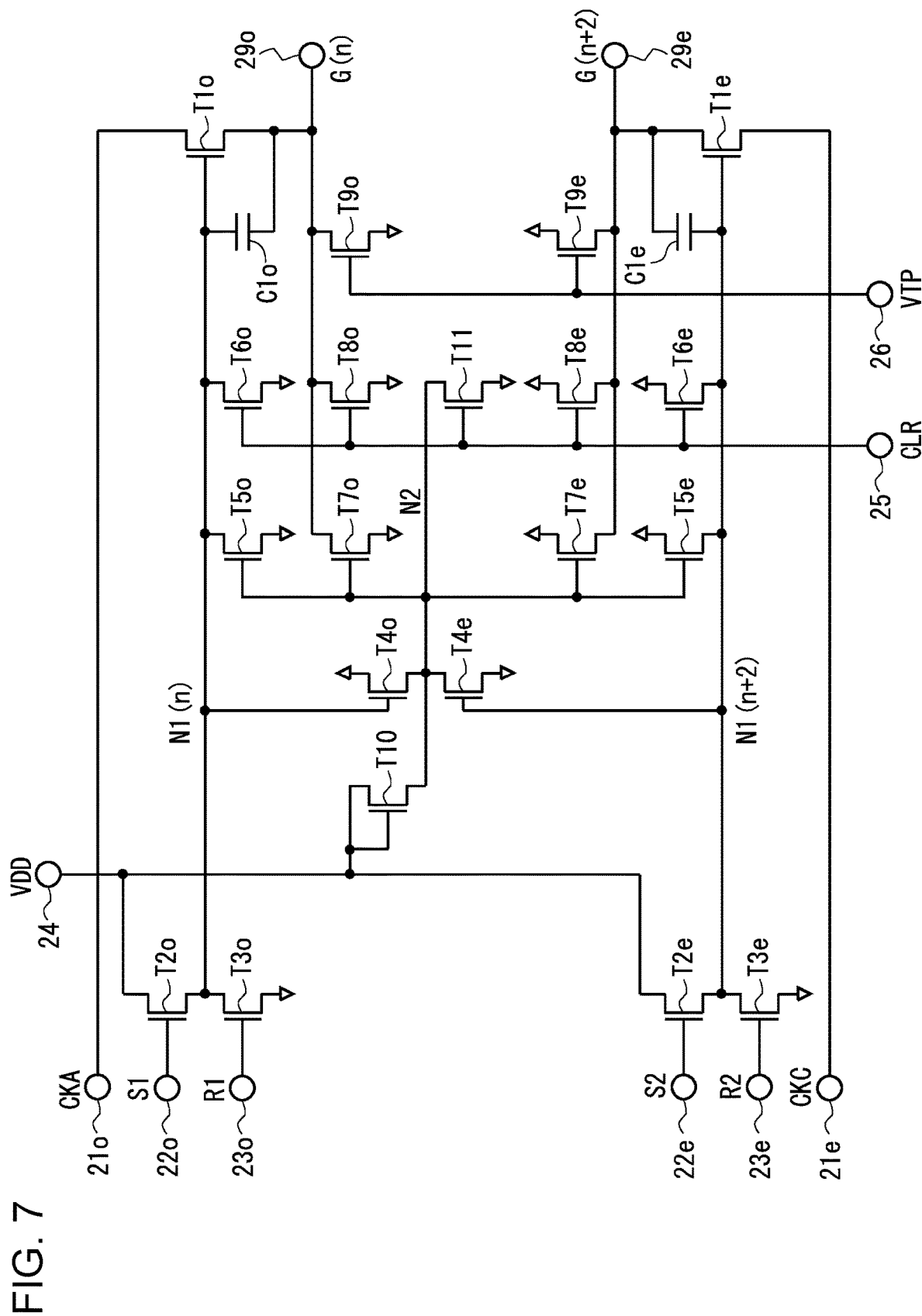
FIG. 7 is a circuit diagram illustrating a configuration of a unit circuit according to the first embodiment.

FIG. 7 is a circuit diagram illustrating a configuration of the unit circuit 2 according to the present embodiment. It is assumed that the unit circuit 2 illustrated in FIG. 7 is connected to the gate bus line GL(n) in the nth row and the gate bus line GL(n+2) in the (n+2)th row. As illustrated in FIG. 7, the unit circuit 2 includes 20 thin film transistors T1o to T9o, T1e to T9e, T10, and T11 and two capacitors (capacitance elements) C1o and C1e. The unit circuit 2 includes nine input terminals 21o to 23o, 21e to 23e, and 24 to 26 and two output terminals 29o and 29e in addition to the input terminal for the DC power supply voltage VSS. Here, the input terminal for receiving the input clock signal CKA is denoted by a reference symbol 21o, the input terminal for receiving the set signal S1 is denoted by a reference symbol 22o, the input terminal for receiving the reset signal R1 is denoted by a reference symbol 23o, the input terminal for receiving the input clock signal CKC is denoted by a reference symbol 21e, the input terminal for receiving the set signal S2 is denoted by a reference symbol 22e, the input terminal for receiving the reset signal R2 is denoted by a reference symbol 23e, the input terminal for receiving the DC power supply voltage VDD is denoted by a reference numeral 24, the input terminal for receiving the clear signal CLR is denoted by a reference numeral 25, and the input terminal for receiving the control signal VTP is denoted by a reference numeral 26. The output terminal for outputting the output signal G(n) is denoted by a reference symbol 29o, and the output terminal for outputting the output signal G(n+2) is denoted by a reference symbol 29e. The clear signal CLR in FIG. 7 corresponds to the clear signal CLR3 in FIG. 5, the control signal VTP in FIG. 7 corresponds to the control signal VTP1 in FIG. 5, the output signal G(n) in FIG. 7 corresponds to the output signal G1 in FIG. 5, and the output signal G(n+2) in FIG. 7 corresponds to the output signal G2 in FIG. 5. A configuration element corresponding to the odd-numbered gate bus line GL among the gate bus lines GL connected to the shift register 210L is denoted by a reference symbol having an end to which "o" is attached, and a configuration element corresponding to the even-numbered gate bus line GL among the gate bus lines GL connected to the shift register 210L is denoted by a reference symbol having an end to which "e" is attached.

Next, a connection relationship between the configuration elements in the unit circuit 2 will be described. A gate terminal of the thin film transistor T1o, a source terminal of the thin film transistor T2o, a drain terminal of the thin film transistor T3o, a gate terminal of the thin film transistor T4o, a drain terminal of the thin film transistor T5o, a drain terminal of the thin film transistor T6o, one terminal of the capacitor C1o are connected to each other via a charge holding node N1(n). Likewise, a gate terminal of the thin film transistor T1e, a source terminal of the thin film transistor T2e, a drain terminal of the thin film transistor T3e, a gate terminal of the thin film transistor T4e, a drain terminal of the thin film transistor T5e, a drain terminal of the thin film transistor T6e, and one terminal of the capacitor C1e are connected to each other via a charge holding node N1(n+2). A drain terminal of the thin film transistor T4o, a gate terminal of the thin film transistor T5o, a gate terminal of the thin film transistor T7o, a drain terminal of the thin film transistor T4e, a gate terminal of the thin film transistor T5e, a gate terminal of the thin film transistor T7e, a source terminal of the thin film transistor T10, and a drain terminal of the thin film transistor T11 are connected to each other via a stabilization node N2.

In the thin film transistor T1o, the gate terminal is connected to the charge holding node N1(n), a drain terminal is connected to the input terminal 21o, and a source terminal is connected to the output terminal 29o. In the thin film transistor T2o, a gate terminal is connected to the input terminal 22o, a drain terminal is connected to the input terminal 24, and the source terminal is connected to the charge holding node N1(n). In the thin film transistor T3o, a gate terminal is connected to the input terminal 23o, the drain terminal is connected to the charge holding node N1(n), and a source terminal is connected to the input terminal for the DC power supply voltage VSS. In the thin film transistor T4o, the gate terminal is connected to the charge holding node N1(n), the drain terminal is connected to the stabilization node N2, and a source terminal is connected to the input terminal for the DC power supply voltage VSS. In the thin film transistor T5o, the gate terminal is connected to the stabilization node N2, the drain terminal is connected to the charge holding node N1(n), and a source terminal is connected to the input terminal for the DC power supply voltage VSS. In the thin film transistor T6o, a gate terminal is connected to the input terminal 25, the drain terminal is connected to the charge holding node N1(n), and a source terminal is connected to the input terminal for the DC power supply voltage VSS. In the thin film transistor T7o, the gate terminal is connected to the stabilization node N2, a drain terminal is connected to the output terminal 29o, and a source terminal is connected to the input terminal for the DC power supply voltage VSS. In the thin film transistor T8o, a gate terminal is connected to the input terminal 25, a drain terminal is connected to the output terminal 29o, and a source terminal is connected to the input terminal for the DC power supply voltage VSS. In the thin film transistor T9o, a gate terminal is connected to the input terminal 26, a drain terminal is connected to the output terminal 29o, and a source terminal is connected to the input terminal for the DC power supply voltage VSS. The thin film transistors T1e to T9e are the same as the thin film transistors T1o to T9o.

In the thin film transistor T10, a gate terminal and a drain terminal are connected to the input terminal 24 (that is, diode-connected), and the source terminal is connected to the stabilization node N2. In the thin film transistor T11, a gate terminal is connected to the input terminal 25, the drain terminal is connected to the stabilization node N2, and a source terminal is connected to the input terminal for the DC power supply voltage VSS. In the capacitor C1o, one terminal is connected to the charge holding node N1(n), and the other terminal is connected to the output terminal 29o. In the capacitor C1e, one terminal is connected to the charge holding node N1(n+2), and the other terminal is connected to the output terminal 29e.

As can be seen from FIG. 7, the stabilization node N2 is commonly used by a portion corresponding to the gate bus line GL(n) in the nth row and a portion corresponding to the gate bus line GL(n+2) in the (n+2)th row. By adopting the configuration, it is possible to reduce the number of elements demanded for the entire gate driver 200.

Next, a function of each configuration element will be described. When a potential of the charge holding node N1(n) is in a high level, the thin film transistor T1o applies a potential of the input clock signal CKA to the output terminal 29o. When the set signal S1 is in a high level, the thin film transistor T2o changes the potential of the charge holding node N1(n) to a high level. When the reset signal R1 is in a high level, the thin film transistor T3o changes the potential of the charge; holding node N1(n) to a low level. When the potential of the charge holding node N1(n) is in a high level, the thin film transistor T4o changes a potential of the stabilization node N2 to a low level. When the potential of the stabilization node N2 is in a high level, the thin film transistor T5o changes the potential of the charge holding node N1(n) to a low level. When the clear signal CLR is in a high level, the thin film transistor T6o changes the potential of the charge holding node N1(n) to a low level. When the potential of the stabilization node N2 is in a high level, the thin film transistor T7o changes a potential of the output terminal 29o (potential of the output signal G(n)) to a low level. When the clear signal CLR is in a high level, the thin film transistor T8o changes the potential of the output terminal 29o (the potential of the output signal G(n)) to a low level. When the control signal VTP is in a high level, the thin film transistor T9o changes the potential of the output terminal 29o (the potential of the output signal G(n)) to a low level. The thin film transistors T1e to T9e are similar to the thin film transistors T1o to T9o.

The thin film transistor T10 maintains the potential of the stabilization node N2 to a high level unless at least one of the thin film transistor T4o, the thin film transistor T4e, and the thin film transistor T11 is in an ON state. When the clear signal CLR is in a high level, the thin film transistor T11 changes the potential of the stabilization node N2 to a low level. The capacitor C1o functions as a bootstrap capacitor for raising the potential of the charge holding node N1(n). The capacitor C1e functions as a bootstrap capacitor for raising the potential of the charge holding node N1(n+2).

In the present embodiment, the thin film transistors T3o, T5o, T6o, T3e, T5e, and T6e correspond to charge holding node turn-off transistors, the thin film transistors T6o and T6e correspond to first stabilization transistors, the thin film transistors T3o and T3e correspond to second stabilization transistors, and the thin film transistors T5o and T5e correspond to third stabilization transistors. In addition, the thin film transistors T1o and T1e correspond to output control transistors.

1.4 Operation of Gate Driver

Next, an operation of the gate driver 200 will be described. First, an operation when scanning is not halted halfway will be described, and then an operation when the scanning is halted halfway will be described.

1.4.1 Operation when Scanning is not Halted Halfway

Figure 8:
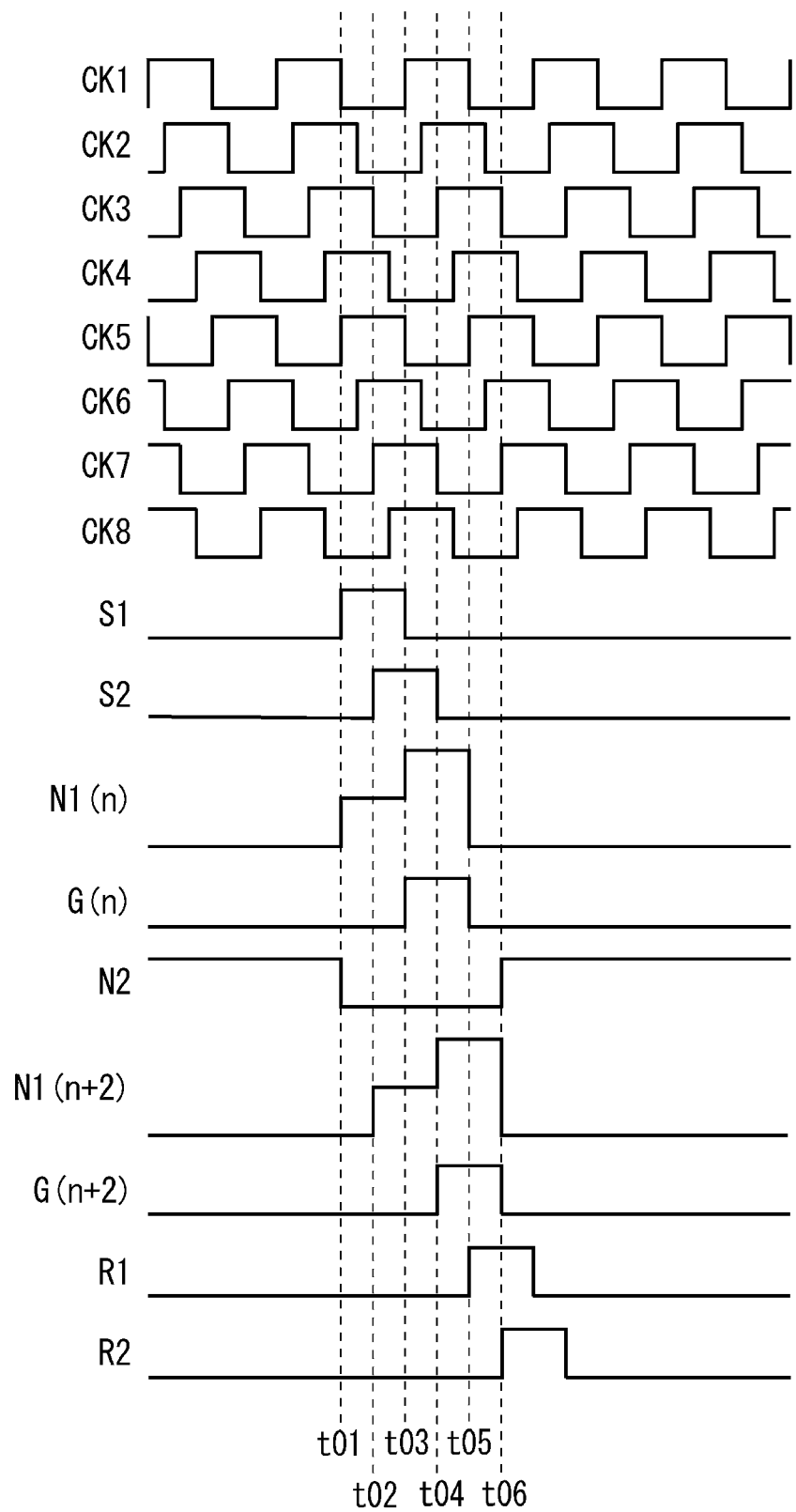
FIG. 8 is a signal waveform diagram illustrating an operation of a unit circuit when scanning is not halted halfway, in the first embodiment.

FIG. 8 is a signal waveform diagram illustrating an operation of one unit circuit 2 when scanning is not halted halfway. It is assumed that the gate clock signal CK1 is input to the unit circuit 2 which will be described here as the input clock signal CKA, and the gate clock signal CK3 is input to the unit circuit 2 as the input clock signal CKC.

During a period before a point of time t01, the set signal S1 is in a low level, the set signal S2 is in a low level, a potential of the charge holding node N1(n) is in a low level, the output signal G(n) is in a low level, a potential of the stabilization node N2 is in a high level, a potential of the charge holding node N1(n+2) is in a low level, the output signal G(n+2) is in a low level, the reset signal R1 is in a low level, and the reset signal R2 is in a low level. The input clock signal CKA (gate clock signal CK1) and the input clock signal CKC (gate clock signal CK3) alternatively repeat a high level and a low level. Meanwhile, a parasitic capacitance exists in the thin film transistor T1o in the unit circuit 2. Accordingly, during the period before the point of time t01, the potential of the charge holding node N1(n) may change due to a clock operation of the input clock signal CKA and existence of the parasitic capacitance of the thin film transistor T1o. Thus, a potential of the output terminal 29o (potential of the output signal G(n)), that is, a potential of the scan signal G(n) applied to the gate bus line GL(n) may be increased. However, during the; potential of the stabilization node N2 is maintained as a high level, the thin film transistors T5o and T7o are maintained in an ON state. Accordingly, during the period before the point of time t01, the thin film transistors T5o and T7o are maintained in the ON state, and the potential of the charge holding node N1(n) and the potential of the output terminal 29o (the potential of the output signal G(n)) are reliably maintained in the low level. As described above, even if noise caused by the clock operation of the input clock signal CKA is mixed in the charge holding node N1(n), the potential of the corresponding scan signal G(n) does not increase. Likewise, even if noise caused by the clock operation of the input clock signal CKC is mixed in the charge holding node N1(n+2), the potential of the corresponding scan signal G(n+2) does not increase. Thereby, an abnormal operation due to the clock operation of the input clock signals CKA and CKC is not performed.

For example, the gate clock signal CK1 and the gate clock signal CK5 are in opposite phases. The gate clock signal CK5 goes to a low level when the gate clock signal CK1 goes to a high level, and the gate clock signal CK5 goes to a high level when the gate clock signal CK1 goes to a low level. However, the signals are not limited to the waveforms, and a period during which both the gate clock signal CK1 and the gate clock signal CK5 go to a low level may be provided. A relationship between the gate clock signal CK2 and the gate clock signal CK6, a relationship between the gate clock signal CK3 and the gate clock signal CK7, and a relationship between the gate clock signal CK4 and the gate clock signal CK8 are the same as above.

At the point of time t01, the set signal S1 changes from a low level to a high level. Accordingly, the thin film transistor T2o is turned on, and the capacitor C1o is charged. Thereby, the potential of the charge holding node N1(n) changes from the low level to the high level, and the thin film transistor T1o is turned on. At the point of time t01, since the input clock signal CKA (gate clock signal CK1) is in the low level, the output signal G(n) is maintained in the low level. As the potential of the charge holding node N1(n) changes from the low level to the high level, the thin film transistor T4o is turned on. Thereby, the potential of the stabilization node N2 goes to the low level. Likewise, at a point of time t02, as the set signal S2 changes from the low level to the high level, the potential of the charge holding node N1(n+2) changes from the low level to the high level.

At a point of time t03, the input clock signal CKA (gate clock signal CK1) changes from a low level to a high level. At this time, since the thin film transistor T1o is in an ON state, a potential of the output terminal 29o increases as a potential of the input terminal 21o increases. Here, since the capacitor C1o is provided between the charge holding node N1(n) and the output terminal 29o as illustrated in FIG. 7, the potential of the charge holding node N1(n) increases as the potential of the output terminal 29o increases (charge holding node N1(n) is bootstrapped). As a result, a large voltage is applied to the gate terminal of the thin film transistor T1o, and thereby, a potential of the output signal G(n) increases to a level sufficient for the gate bus line GL(n) connected to the output terminal 29o to be in a selected state. Likewise, at a point of time t04, the input clock signal CKC (gate clock signal CK3) changes from the low level to the high level, and thereby, a potential of the gate bus line GL(n+2) increases to a level sufficient for the output signal G(n+2) connected to the output terminal 29e to be in the selected state.

At a point of time t05, the input clock signal CKA (gate clock signal CK1) changes from the high level to the low level. Thereby, the potential of the output terminal 29o (potential of the output signal G(n)) decreases as the potential of the input terminal 21o decreases. If the potential of the output terminal 29o decreases, the potential of the charge holding node N1(n) also decreases via the capacitor C1o. At the point of time t05, the reset signal R1 changes from the low level to the high level. Thereby, the thin film transistor T3o is turned on. As a result, the potential of the charge; holding node N1(n) decreases to the low level. Thereby, the thin film transistor T4o is turned off. Likewise, at a point of time t06, the potential of the output terminal 29e (the potential of the output signal G(n+2)) decreases as the input clock signal CKC (the gate clock signal CK3) changes from the high level to the low level. The potential of the charge holding node N1(n+2) decreases to the low level as the reset signal R2 changes from the low level to the high level. Thereby, the thin film transistor T4e is turned off. At the point of time t06, as the thin film transistors T4o and T4e are turned off, the potential of the stabilization node N2 changes from the low level to the high level. As a result, the thin film transistors T7o and T7e are turned on, and thereby, the potential of the output terminal 29o (the potential of the output signal G(n)) and the potential of the output terminal 29e (the potential of the output signal G(n+2)) go to the low level. During a period after the point of time t06, the same operation as in the period before the point of time t01 is performed.

As the above-described operations are performed by each unit circuit 2, the plurality of gate bus lines GL(1) to GL(i) provided in the liquid crystal display device are sequentially selected, and writing to the pixel capacitances is successively performed.

After scanning all the gate bus lines GL is completed, the clear signal CLR goes to the high level. Thereby, the thin film transistors T6o, T6e, T8o, T8e, and T11 are turned on. As a result, the potentials of the charge holding nodes N1(n) and N1(n+2), the output terminals 29o and 29e, and the stabilization node N2 go to the low level. That is, states of all the unit circuits 2 are reset. The reason why the states of all the unit circuits 2 are reset in this way is that, if an off leakage in the thin film transistor is small, the frame is switched in a state where residual electric charges are accumulated in internal nodes of each unit circuit 2, and the residual charges affect display of subsequent frames. Particularly, in a case where an oxide TFT is adopted, it is preferable to reset the states of all the unit circuits 2 in this way. It is preferable to reset the states of all the unit circuits 2 by setting the clear signal CLR to the high level even when the power supply of the liquid crystal display device is turned off.

1.4.2 Operation When Scanning Is Halted Halfway

Figure 9:
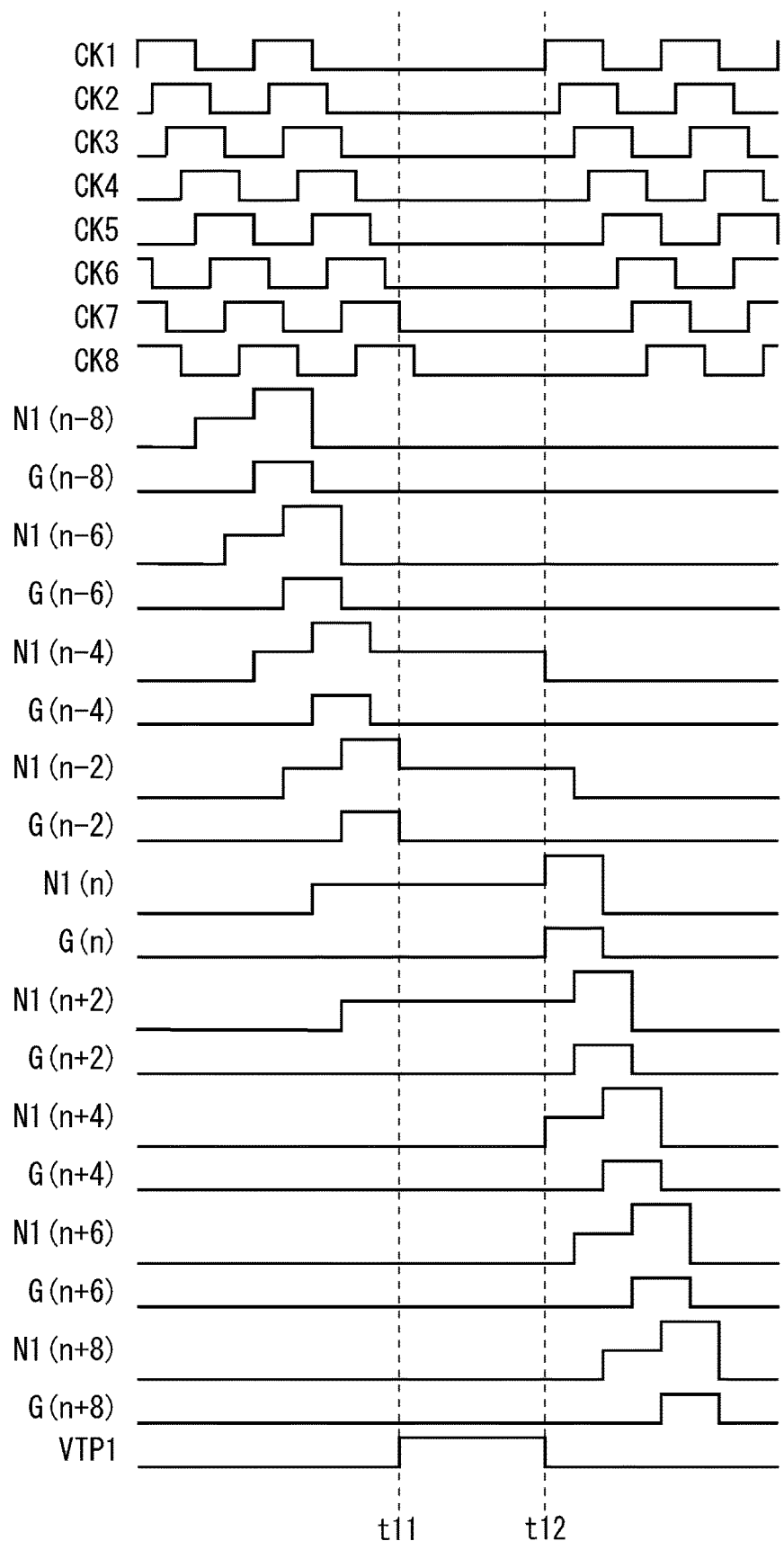
FIG. 9 is a signal waveform diagram illustrating an operation of the shift register (shift register disposed on one end side of the display unit) when the scanning is halted halfway, in the first embodiment.

FIG. 9 is a signal waveform diagram illustrating an operation of the shift register 210L when scanning is halted halfway. Here, it is assumed that an idle period (a period from a point of time t11 to a point of time t12) is provided between when the scan signal G(n-2) goes to the high level and when the scan signal G(n) goes to the high level.

During a period before the point of time t11, the scan signals G sequentially go to the high level as illustrated in FIG. 9. At a point of time t11, clock operations of the gate clock signals CK1 to CK8 are halted. In the example illustrated in FIG. 9, the clock operation of the gate clock signal CK8 is halted last, and the clock operation of the gate clock signal CK1 is restarted first, but the present embodiment is not limited thereto. Potentials of charge holding nodes in each unit circuit 2 are maintained at a level immediately before the point of time t11 through the idle period (the period from the point of time t11 to the point of time t12). In the example illustrated in FIG. 9, the potentials of the charge holding nodes N1(n-4), N1(n-2), N1(n), and N1(n+2) are maintained in the high level through the idle period. As illustrated in FIG. 9, the control signal VTP1 is maintained in the high level during the idle period. Thereby, during the idle period, all the unit circuits 2 maintain the thin film transistors T9o and T9e in an ON state, and all the scan signals G are maintained in the low level. In FIG. 9, the control signal VTP1 is in the high level through the entire periods of the idle period, but the control signal VTP1 may be in the high level in part of the idle period.

At the point of time t12, the clock operations of the gate clock signals CK1 to CK8 restart. Thereby, the potential of the charge holding node N1(n) increases greatly (the charge holding node N1(n) is bootstrapped), and the scan signal G(n) goes to the high level. By doing so, scanning the gate bus line GL is restarted from the nth row.

1.5 Countermeasure Against Leakage of Charges

Although a length of the idle period depends on specifications of a panel or performance specifications of a touch panel, the length of the idle period is generally 100 microseconds to 600 microseconds. In order to normally restart the scanning as described above after the idle period of the length ends, the potentials of the charge holding nodes N1(n) and N1(n+2) may be maintained during the idle period. That is, charges may not leak from the charge holding nodes N1(n) and N1(n+2) through the thin film transistor (that is, off leak in the thin film transistor) during the idle period. In the present embodiment, gate lengths of the thin film transistors T6o and T6e of the thin film transistors provided in the unit circuit 2 are larger than gate lengths of the other charge holding node turn-off transistors (thin film transistors T3o, T5o, T3e, and T5e), as a countermeasure against the leakage of charges. The reason why the structure is adopted will be described below.

Figure 10:
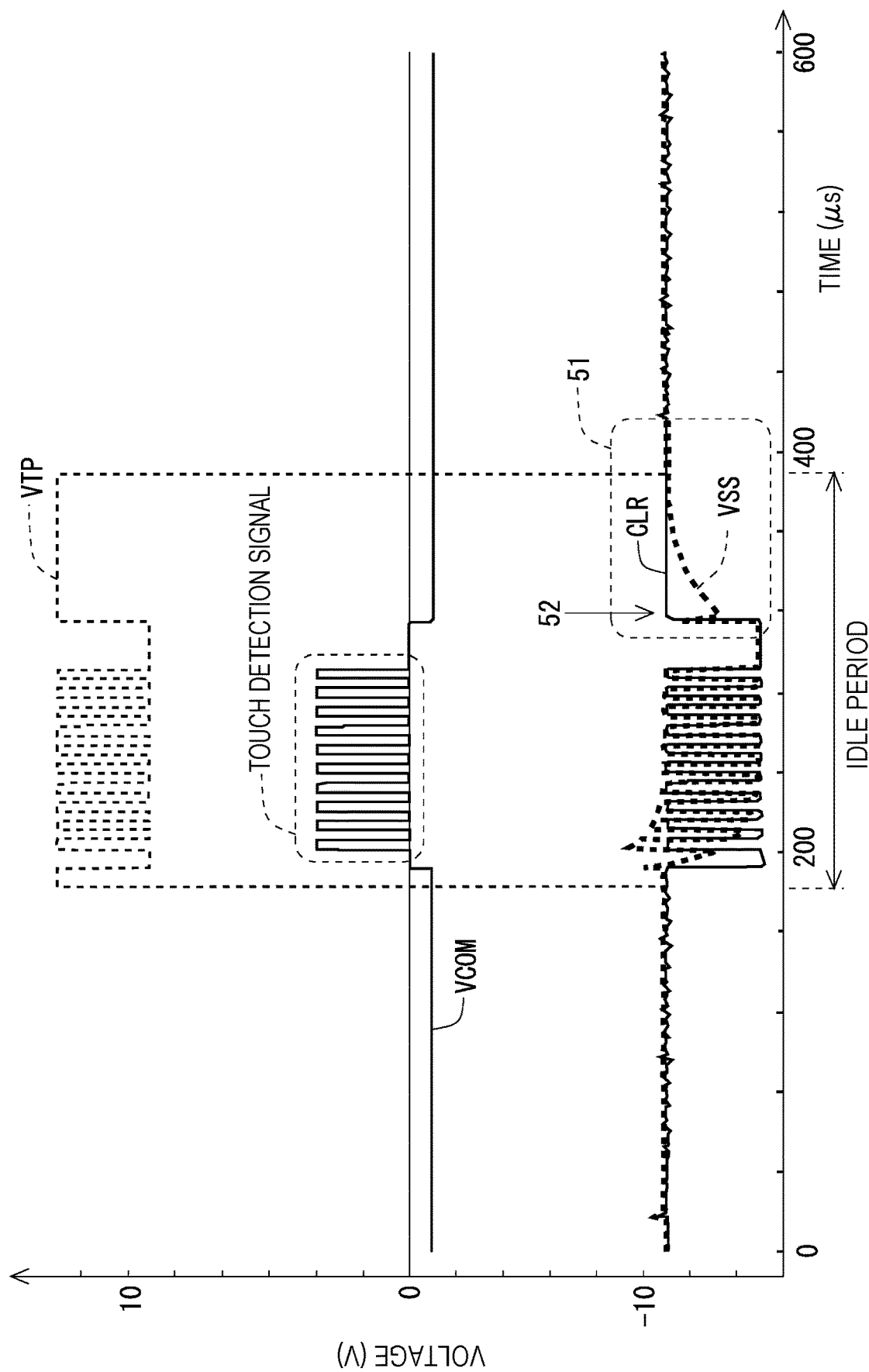
FIG. 10 is a signal waveform diagram illustrating results of a simulation in which waveforms of a clear signal, a control signal, and a DC power supply voltage are changed to be the same as a waveform, of a touch detection signal during an idle period, in relation to the first embodiment.

In a case where a full in-cell type touch panel is adopted, a touch detection signal (touch panel voltage) which is a high frequency voltage is applied to the common electrode 44 (see FIG. 3) in order to perform a touch position detection processing during the idle period. A frequency of the touch detection signal depends on the performance specifications of the touch panel, and frequency is generally set to several tens kHz to several hundreds kHz (in many cases, 80 kHz to 600 kHz). An amplitude of the touch detection signal also depends on the performance specification of the touch panel, and the amplitude is generally set to 2 V to 12 V. In order to allow the touch detection signal which is a high frequency voltage to be applied to the common electrode 44 in the liquid crystal panel without dullness or delay, it is preferable to change a waveform of part of an input signal to the gate driver 200 in the same manner as the waveform of the touch detection signal in the idle period. Therefore, in the present embodiment, while the touch detection signal is applied to the common electrode 44 in the idle period, waveforms of the clear signals CLR (CLR1 to CLR4), waveforms of the control signals VTP (VTP1 and VTP2), and a waveform of the DC power supply voltage VSS are changed in the same manner as the waveform of the touch detection signal as illustrated in FIG. 10.

Regarding the unit circuit 2 illustrated in FIG. 7, examples of thin film transistors on a leak path where charges flow out from the charge holding nodes N1(n) and N1(n+2) include thin film transistors (charge holding node turn-off transistors) T3o, T5o, T6o, T3e, T5e, and T6e having drain terminals connected to the charge holding node N1(n) or N1(n+2) and source terminals connected to the input terminals for the DC power supply voltage VSS. Among the thin film transistors, attention is paid to the thin film transistors T3o, T5o, and T6o. In a case where a waveform of an input signal to the gate driver 200 is not changed in the same manner as the waveform of the touch detection signal during the idle period, all gate-source voltages Vgs of the thin film transistors T3o, T5o, and T6o become approximately zero during the idle period. The reason is that the DC power supply voltage VSS is applied to the source terminals of the thin film transistors T3o, T5o, and T6o, and a potential of the reset signal R1 applied to the gate terminal of the thin film transistor T3o, a potential of the stabilization node N2 connected to the gate terminal of the thin film transistor T5o, and a potential of the clear signal CLR applied to the gate terminal of the thin film transistor T6o are all equal to a potential based on the DC power supply voltage VSS, during the idle period. In this case, if a thin film transistor with excellent off characteristics such as an oxide TFT is adopted, the gate lengths of the thin film transistors T3o, T5o, and T6o may not have to be lengthened for the purpose of prohibiting charges from flowing out from the charge holding node N1(n). The same applies to the thin film transistors T3e, T5e, and T6e.

In a case where waveforms of part (specifically, the clear signal CLR, the control signal VTP, and the DC power supply voltage VSS) of the input signals to the gate driver 200 is changed in the same manner as the waveform of the touch detection signal during the idle period, even if a thin film transistor excellent in off characteristics is adopted, the gate-source voltage Vgs of the thin film transistor is transiently larger than zero, and a leakage current may be generated. For an actual full in-cell type touch panel, a final adjustment of a touch panel function is often performed by adjusting a length of the idle period and a frequency/amplitude of the touch detection signal after manufacturing or modularization. Accordingly, the waveform of the touch detection signal may be different from design time of the gate driver 200 after manufacturing. Thus, in consideration of this point, a countermeasure against leakage of charges through the thin film transistor may be made.

Figure 11:
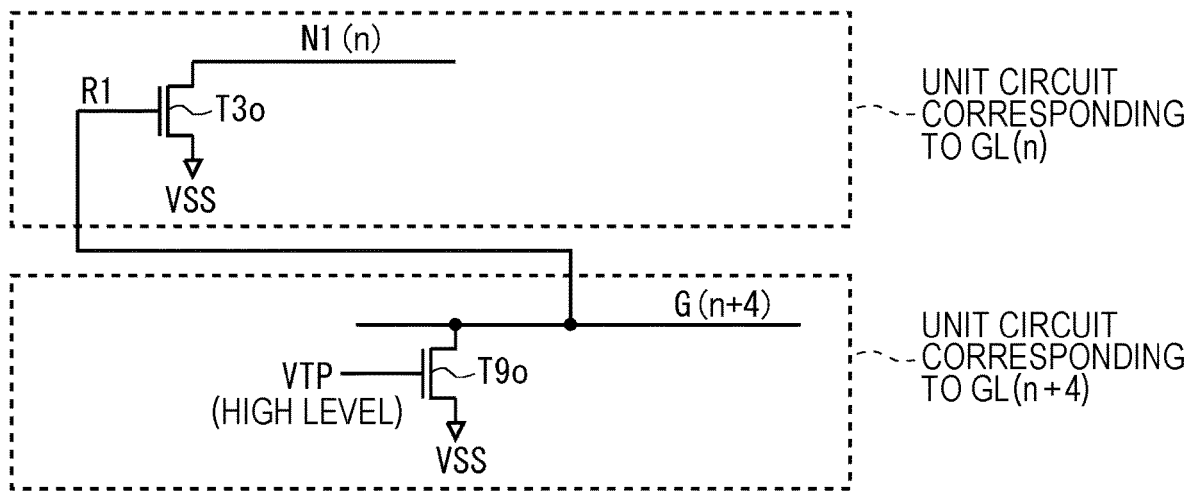
FIG. 11 is a diagram illustrating a state of one thin film transistor during the idle period in relation to the first embodiment.
Figure 12:
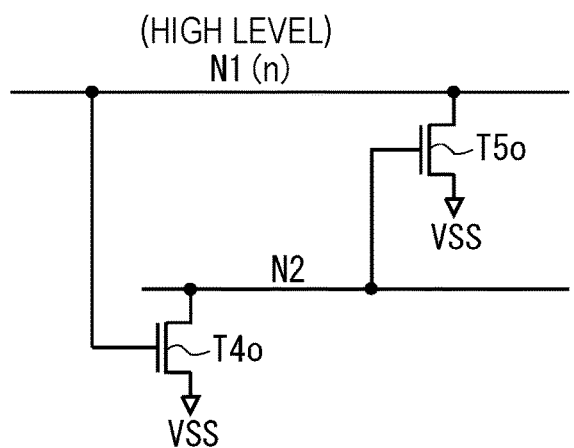
FIG. 12 is a diagram illustrating a state of another thin film transistor during the idle period in relation to the first embodiment.
Figure 13:
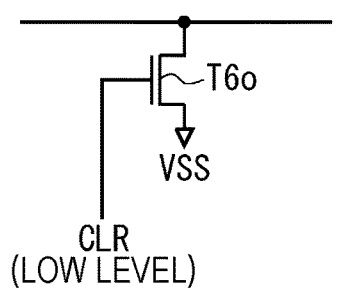
FIG. 13 is a diagram illustrating a state of still another thin film transistor during the idle period in relation to the first embodiment.

Here, attention is paid to the states of the thin film transistors T3o, T5o, and T6o during the idle period. The reset signal R1 is applied to the gate terminal of the thin film transistor T3o. In this regard, as described above, the output signal G1 output from the unit circuit 2L(q+1) is applied to the unit circuit 2L(q) of a certain stage (here, assumed to be a qth stage) as the reset signal R1 (see FIG. 5). In other words, the scan signal G(n+4) for the gate bus line GL(n+4) in the (n+4)th row is input to the gate terminal of the thin film transistor T3o corresponding to the gate bus line GL(n) in the nth row as the reset signal R1. Thus, as illustrated in FIG. 11, the gate terminal of the thin film transistor T3o corresponding to the gate bus line GL(n) in the nth row is connected to the drain terminal of the thin film transistor T9o corresponding to the gate bus line GL(n+4) in the (n+4)th row. Here, as described above, the control signal VTP is maintained in a high level during the idle period. Therefore, the DC power supply voltage VSS is applied to the gate terminal of the thin film transistor T3o via the thin film transistor T9o as illustrated in FIG. 11. In the example illustrated in FIG. 9, the potential of the charge holding node N1(n) is in the high level during the idle period. Thus, the DC power-supply voltage VSS is applied to the gate terminal of the thin film transistor T5o via the thin film transistor T4o as illustrated in FIG. 12. The clear signal CLR in a low level is applied to the gate terminal of the thin film transistor T6o as illustrated in FIG. 13. As described above, the waveforms of the clear signal CLR, the control signal VTP, and the DC power supply voltage VSS are the same as the waveform of the touch detection signal during the period in which the touch detection signal is applied to the common electrode 44 in the idle period (see FIG. 10). Considering only the above points, it seems that there is no difference between the states of the thin film transistors T3o, T5o, and T6o.

As illustrated in FIG. 7, while the input terminal for the DC power supply voltage VSS is connected to a large number of thin film transistors (the thin film transistors T3o, T3e, T4o, T4e, T5o, T5e, T6o, T6e, T7o, T7e, T8o, T8e, T9o, T9e, and T11), the input terminal 25 for the clear signal CLR is connected to a small number of thin film transistors (the thin film transistors T6o, T6e, T8o, T8e, and T11). That is, a load of the input terminal for the DC power supply voltage VSS is larger than a load of the input terminal 25 for the clear signal CLR. Accordingly, a potential difference (voltage) may be transiently generated between the input terminal for the DC power supply voltage VSS and the input terminal 25 for the clear signal CLR. Thus, in the thin film transistors T6o and T6e having a gate terminal to which the clear signal CLR is applied and a source terminal to which the DC power supply voltage VSS is applied, the gate-source voltage Vgs is sometimes transiently increased larger than zero in the idle period.

FIG. 10 is a signal waveform diagram illustrating results of a simulation in which the waveforms of the clear signal CLR, the control signal VTP, and the DC power supply voltage VSS are changed in the same manner as the waveform of the touch detection signal in the idle period. In this example, it is assumed that a liquid crystal panel load of 5.5-inch full HD is used. An actual waveform of the touch detection signal is not limited to the waveform illustrated in FIG. 10. As described above, for example, the waveform of the touch detection signal may be changed after modularization.

In FIG. 10, a waveform change difference between the clear signal CLR and the DC power supply voltage VSS at a position farthest from the input terminal appears at a portion denoted by a reference numeral 51. From FIG. 10, it is understood that the dull waveform is small in the clear signal CLR, whereas the dull waveform is large in the DC power supply voltage VSS. At a portion denoted by a reference numeral 52 in FIG. 10, a large potential difference is transiently generated between, both of them. As illustrated in FIG. 13, in the thin film transistor T6o, the clear signal CLR is applied to the gate terminal, and the DC power supply voltage VSS is applied to the source terminal. Thus, a potential difference is transiently generated between the gate and the source of the thin film transistor T6o. As a result, a leakage current is generated in the thin film transistor T6o, and a potential of the charge holding node N1(n) decreases in the idle period.

As such, in order to normally restart scanning after halt of the scanning in a case where a monolithic gate driver is adopted, it is preferable to suppress a leakage of charges, particularly through the thin film transistors T6o and T6e of the thin film transistors T3o, T3e, T5o, T5e, T6o, and T6e which may be leak paths of the charge holding nodes N1(n) and N1(n+2). The thin film transistors T6o and T6e are provided to reset a state of the charge holding node after all the gate bus lines GL are scanned. Accordingly, in a case where an oxide TFT is used in a configuration in which no idle period is provided, necessity of increasing a channel width (W size) of the thin film transistors T6o and T6e is low, and the channel width is often set to a minimum size (for example, 5 µm) permitted by a process.

In the present embodiment, in consideration of the above points, the gate lengths of the thin film transistors T6o and T6e of the charge holding node turn-off transistors provided in the unit circuit 2 are larger than the gate lengths of the other charge holding node turn-off transistors (the thin film transistors T3o, T5o, T3e, and T5e). The reason why only the gate lengths of the thin film transistors T6o and T6e of the charge holding node turn-off transistors are increased is also to suppress expansion of a frame size. In the related art, in a case where oxide TFTs are adopted, the gate lengths are often 4 µm to 9 µm. In contrast to this, in the present embodiment, it is preferable that the gate lengths of the thin film transistors T6o and T6e of the charge holding node turn-off transistors are larger than or equal to 10 µm. However, in order to suppress the expansion of the frame size, it is preferable that the gate lengths are smaller than or equal to 30 µm.

Figure 1:
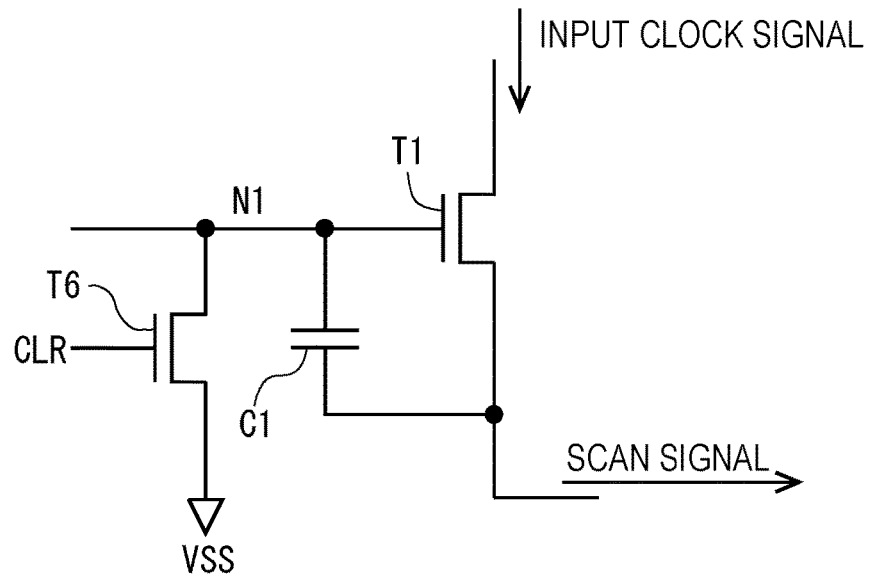
FIG. 1 is a diagram illustrating a countermeasure against leakage of charges in all embodiments.

As described above, in the present embodiment, as illustrated in FIG. 1, the gate length of the thin film transistor T6 (thin film transistor having a gate terminal to which a clear signal CLR going to a high level at the end of a frame period is applied, a drain terminal connected to the charge holding node N1, and a source terminal to which the direct current power supply voltage VSS is applied) is larger than the gate lengths of the other charge holding node turn-off transistors. The same is also applied to the second to sixth embodiments which will be described below. In FIG. 1, the configuration elements corresponding to the odd-numbered gate bus lines GL and the configuration elements corresponding to the even-numbered gate bus lines GL are not distinguished from each other. Accordingly, for example, the thin film transistor T6 in FIG. 1 corresponds to the thin film transistor T6o and the thin film transistor T6e in FIG. 7.

1.6 Effect

According to the present embodiment, the gate lengths of the thin film transistors T6o and T6e, which have drain terminals connected to the charge holding nodes N1(n) and N1(n+2) and are highly likely to generate a transient leakage current in the idle period, are larger than the gate lengths of other charge holding node turn-off transistors (thin film transistors T3o, T5o, T3e, and T5e). As such, by increasing the gate lengths of the thin film transistors T6o and T6e which are highly likely to cause leakage of charges to occur from the charge holding nodes N1(n) and N1(n+2), it is possible to halt and restart the scanning without causing an abnormal operation to be performed. By increasing only the gate lengths of the thin film transistors T6o and T6e to be larger than the gate lengths of the other charge holding node turn-off transistors, expansion of a frame size is suppressed. As described above, according to the present embodiment, the gate driver (gate driver for a liquid crystal display device including a touch panel) 200 capable of halting the scanning halfway while suppressing an expansion of the frame size is realized.

1.7 Modification Example

1.7.1 First Modification Example

In the above-described embodiment, the gate lengths of the thin film transistors T6o and T6e of the charge holding node turn-off transistors provided in the unit circuit 2 are larger than the gate lengths of the other charge holding node turn-off transistors, as a countermeasure against leakage of charges from the charge holding nodes N1(n) and N1(n+2) during the idle period. The present embodiment is not limited to this, and the leakage of charges from the charge holding nodes N1(n) and N1(n+2) may also be prohibited by forming dual gates for each of the thin film transistors T6o and T6e. More specifically, only the thin film transistors T6o and T6e of the charge holding node turn-off transistors provided in the unit circuit 2 may have a dual gate structure, and the other charge holding node turn-off transistors may have a single gate structure. With the configuration, the gate driver 200 capable of halting the scanning halfway while suppressing expansion of the frame size is realized.

In the above description, an example in which the thin film transistors T6o and T6e have each dual gates is illustrated, and each of the gates of the thin film transistors T6o and T6e may be divided into three or more. That is, each of the thin film transistors T6o and T6e may have a multi-gate structure.

In a second modification example and the second to sixth embodiments, instead of making the gate lengths of the thin film transistors T6 (T6o and T6e) larger than the gate lengths of the other charge holding node turn-off transistor, only the thin film transistors T6 (T6o and T6e) of the charge holding node turn-off transistors may also have a multi-gate structure.

1.7.2 Second Modification Example

In the above-described embodiment, only the thin film transistors T6o and T6e of the charge holding node turn-off transistors have the gate length larger than the gate lengths of the other charge holding node turn-off transistors. However, in a case where a thin film transistor other than an oxide TFT is adopted, leakage of charges may occur through thin film transistors other than the thin film transistors T6o and T6e in the idle period.

Therefore, the gate lengths of the thin film transistors T3o, T3e, T5o, and T5e may also be increased. More specifically, the gate lengths of the thin film transistors T6o, T6e, T3o, T3e, T5o, and T5e may be larger than the gate lengths of the other thin film transistors in the unit circuit 2, or the gate lengths of the thin film transistors T6o, T6e, T5o, and T5e may be larger than the gate lengths of the other thin film transistors in the unit circuit 2, or the gate lengths of the thin film transistors T6o, T6e, T3o, and T3e may be larger than the gate lengths of the other thin film transistors in the unit circuit 2. As described in the first modification example, a multi-gate structure may be adopted instead of increasing the gate lengths.

2. Second Embodiment

2.1 Schematic Configuration of Gate Driver

Figure 14:
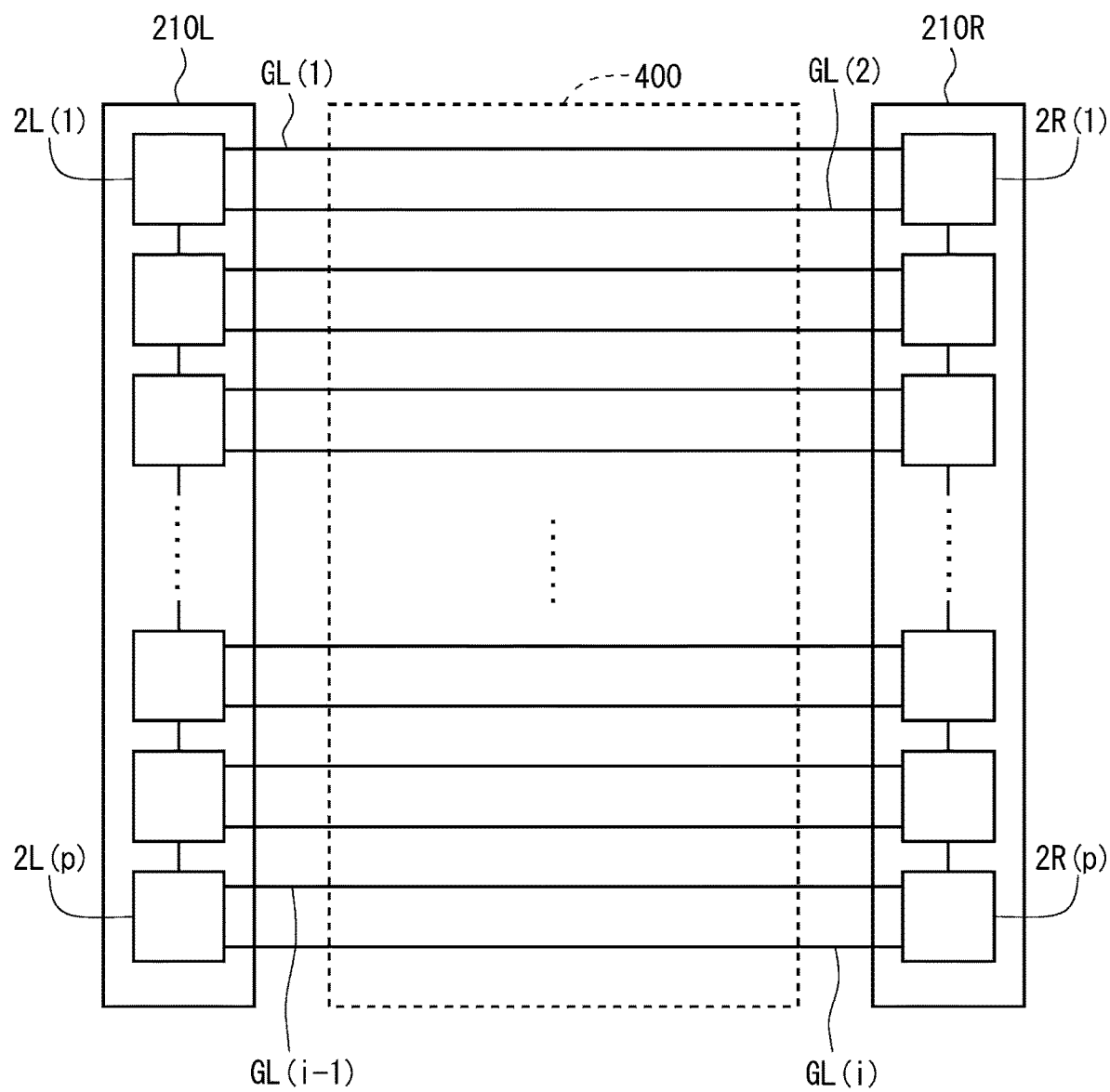
FIG. 14 is a block diagram illustrating a schematic configuration of a gate driver according to a second embodiment.

FIG. 14 is a block diagram illustrating a schematic configuration of the gate driver 200 according to the present embodiment. The gate driver 200 according to the present embodiment is constituted with a shift register 210L disposed on one end side of the display unit 400 and a shift register 210R disposed on the other end side of the display unit 400 in the same manner as in the first embodiment. In the present embodiment, each of the gate bus lines GL(1) to GL(i) is driven by both the shift register 210L and the shift register 210R unlike the first embodiment. That is, each of the gate bus lines GL(1) to GL(i) is driven by both the one end side and the other end side.

The shift register 210L is configured with p unit circuits 2L(1) to 2L(p), and the shift register 210R is configured with p unit circuits 2R(1) to 2R(p). Symbol p denotes i/2. In the same manner as in the first embodiment, each unit circuit 2 is connected to two gate bus lines GL.

2.2. Configuration of Shift Register

Figure 15:
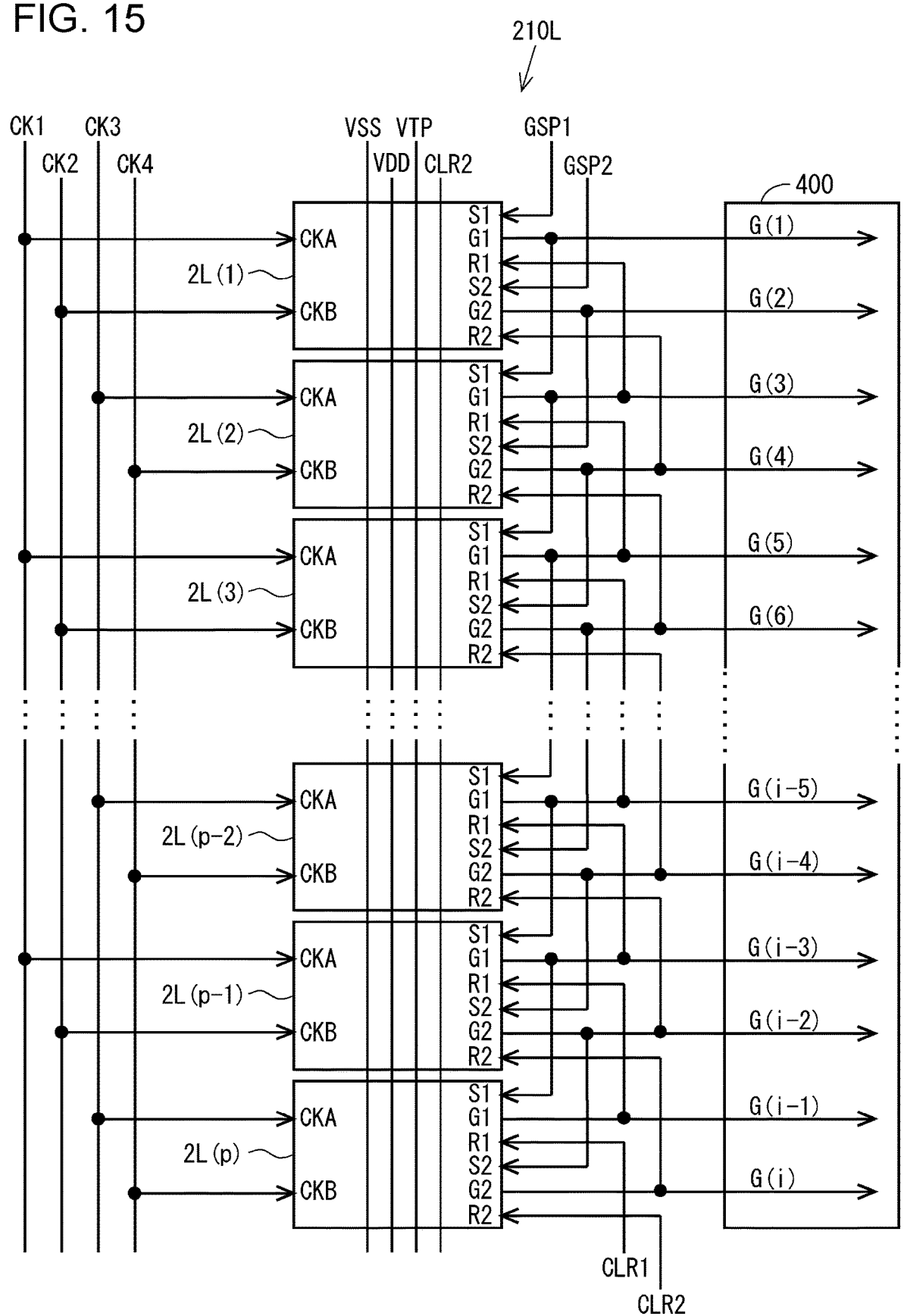
FIG. 15 is a block diagram illustrating a configuration of a shift register disposed on one end side of a display unit, in the second embodiment.
Figure 16:
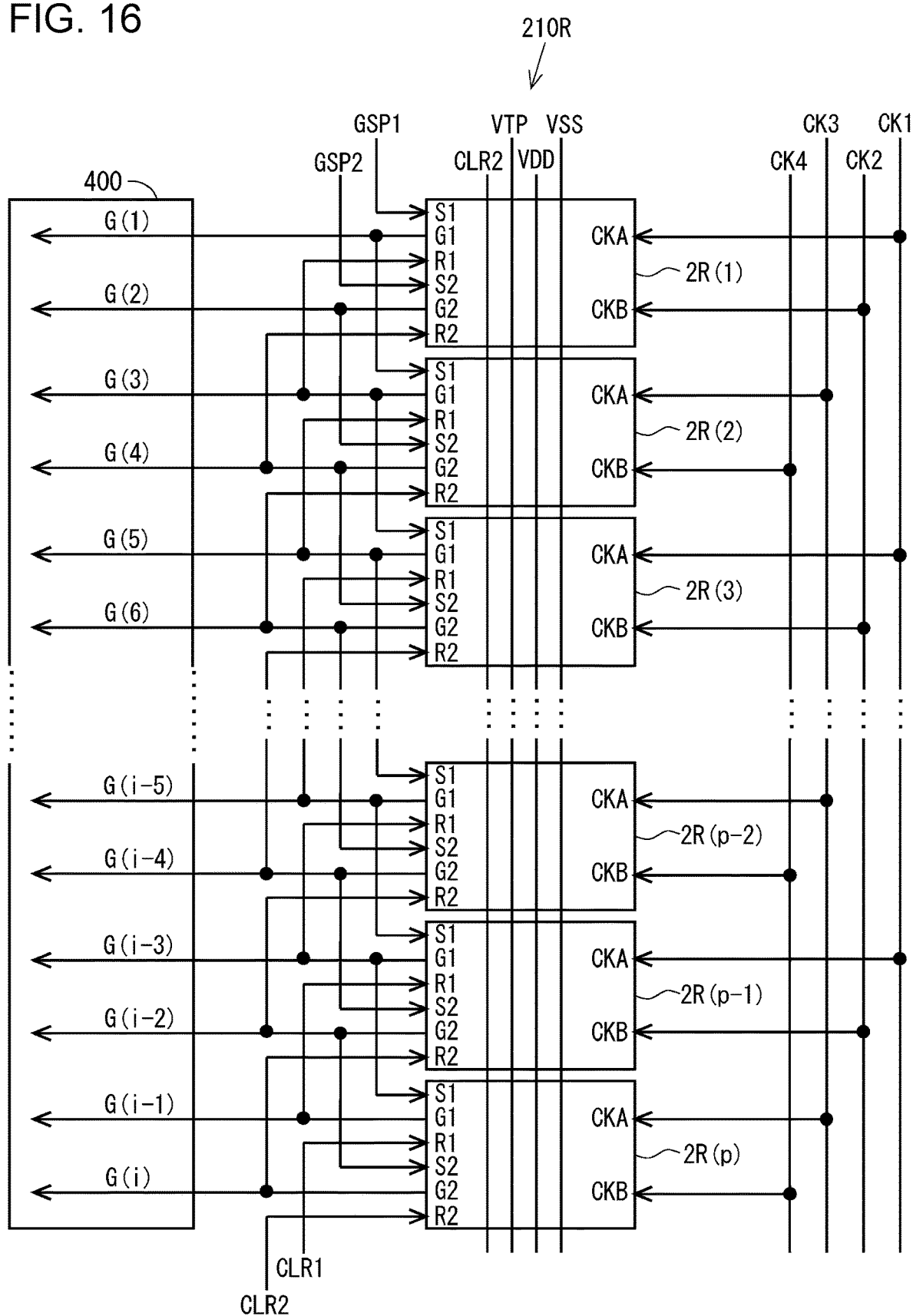
FIG. 16 is a diagram illustrating another shift register disposed on the other end side of the display unit, in the second embodiment.

FIG. 15 is a block diagram illustrating a configuration of the shift register 210L. FIG. 16 is a block diagram illustrating a configuration of the shift register 210R. In the present embodiment, the same signal is input to the shift register 210L and the shift register 210R. The gate start pulse signals GSP1 and GSP2, the clear signals CLR1 and CLR2, the gate clock signals CK1 to CK4, and the control signal VTP are applied to the shift registers 210L and 210R as the gate control signal GCTL. The shift registers 210L and 210R are also supplied with a high-level DC power supply voltage VDD and a low-level DC power supply voltage VSS. The gate clock signals CK1 to CK4 are four-phase clock signals. Hereinafter, only the configuration of the shift register 210L will be described, and description on the configuration of the shift register 210R will be omitted.

In the shift register 210L, the signals applied to each unit circuit 2 are as follows (see FIG. 15). If symbol o is assumed to be an odd number and symbol e is assumed to be an even number, the gate clock signal CK1 is applied to the unit circuit 2L(o) as the input clock signal CKA and the gate clock signal CK2 is applied to the unit circuit 2L(o) as an input clock signal CKB, and the gate clock signal CK3 is applied to the unit circuit 2L(e) as the input clock signal CKA and the gate clock signal CK4 is applied to the unit circuit 2L(e) as the input clock signal CKB. The set signals S1 and S2 and the reset signals R1 and R2 are the same as those in the first embodiment. The DC power supply voltage VSS, the DC power supply voltage VDD, the control signal VTP, and the clear signal CLR2 are commonly applied to all the unit circuits 2.

The output signals G1 and G2 are output from the respective unit circuits 2 of the shift register 210L. The output signal G1 output from the unit circuit 2L(q) in a certain stage (here, assumed to be a qth stage) is applied to the gate bus line GL(2q−1) as the scan signal G(2q−1), is also applied to the unit circuit 2L(q−1) as the reset signal R1, and is applied to the unit circuit 2L(q+1) as the set signal S1. The output signal G2 output from the unit circuit 2L(q) in a certain stage is applied to the gate bus line GL(2q) as the scan signal G(2q), is applied to the unit circuit 2L(q−1) as the reset signal R2, and is applied to the unit circuit 2L(q+1) as the set signal S2. The output signals G1 and G2 output from the unit circuit 2L(1) may not be applied to other unit circuits as reset signals, and the output signals G1 and G2 output from the unit circuit 2L(p) may be applied to the other unit circuits as set signals.

2.3 Configuration of Unit Circuit

A configuration of the unit circuit 2 is the same as the configuration according to the first embodiment (see FIG. 7). However, the input clock signal CKB in FIGS. 15 and 16 corresponds to the input clock signal CKC (a signal applied to the input terminal 21e) in FIG. 7.

2.4 Operation of Gate Driver

2.4.1 Operation when Scanning is not Halted Halfway

Figure 17:
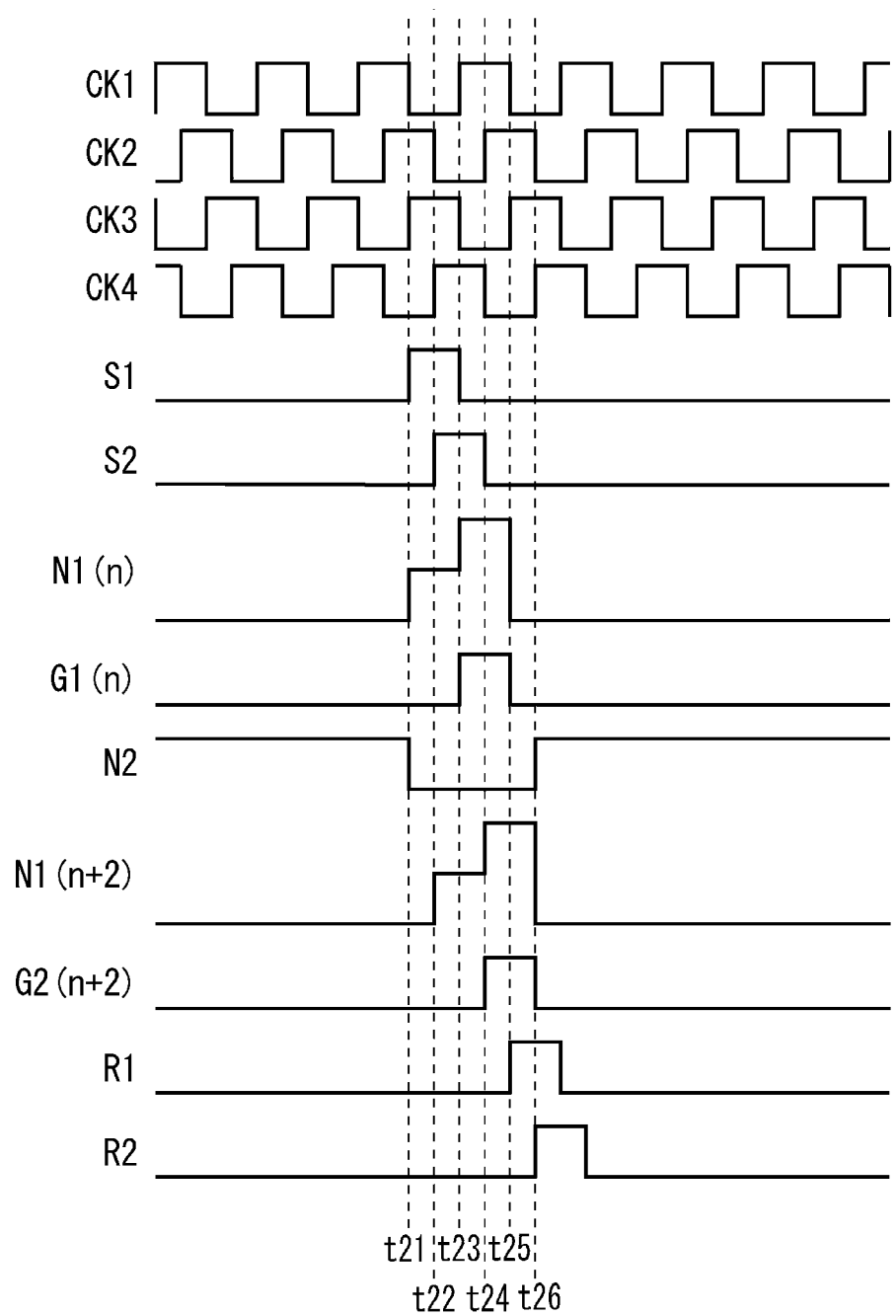
FIG. 17 is a signal waveform diagram illustrating an operation of a unit circuit when scanning is not halted halfway, in the second embodiment.

FIG. 17 is a signal waveform diagram illustrating an operation of one unit circuit 2 when scanning is not halted halfway in the present embodiment. As understood, from FIGS. 8 and 17, the unit circuit 2 according to the present embodiment is the same as in the first embodiment except the unit circuit 2 of the present embodiment operates based on the four-phase gate clock signals CK1 to CK4.

2.4.2 Operation when Scanning is Halted Halfway

Figure 18:
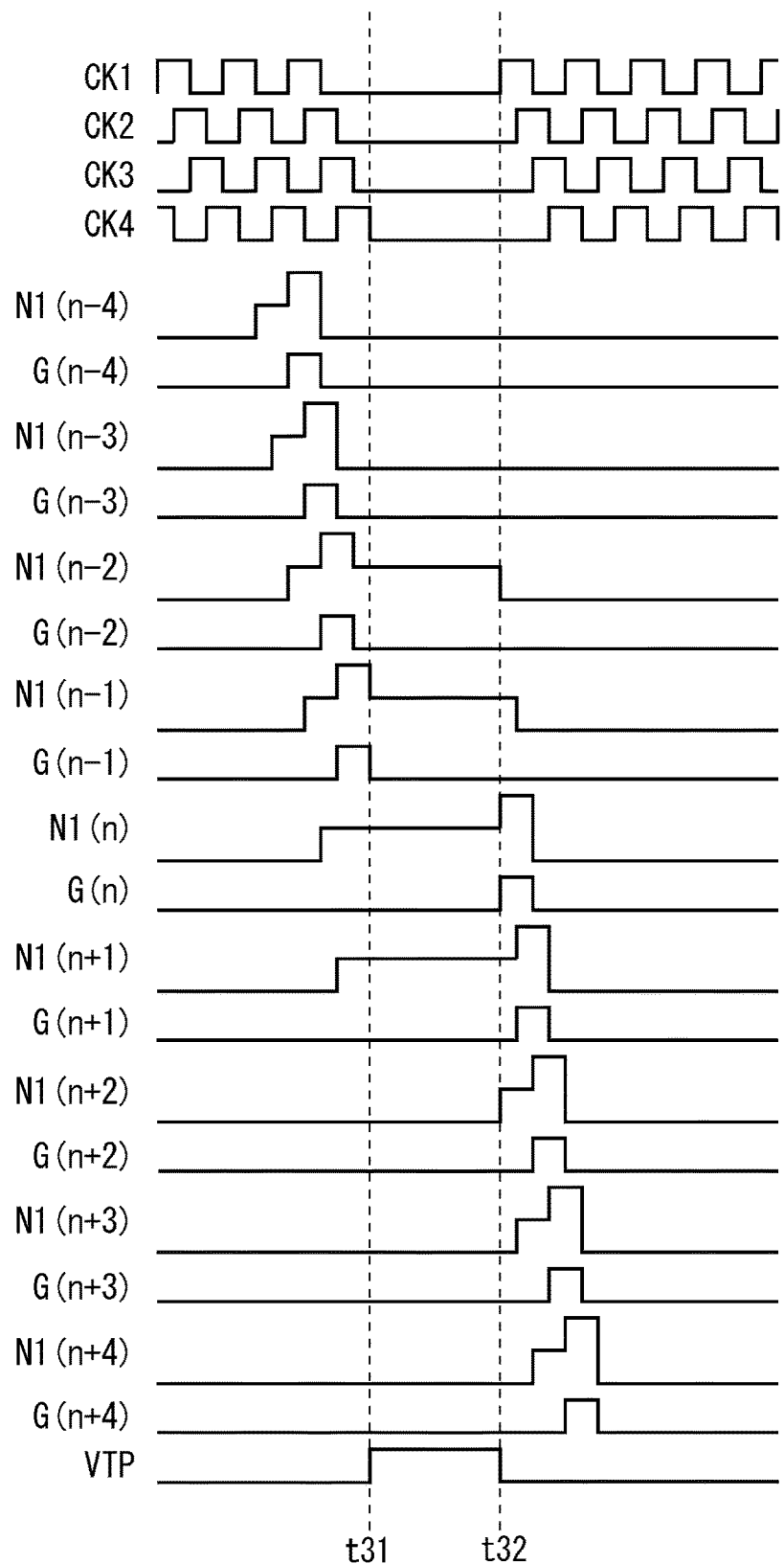
FIG. 18 is a signal waveform diagram illustrating an operation of the shift register (shift register disposed on one end side of the display unit) when the scanning is halted halfway, in the second embodiment.

FIG. 18 is a signal waveform diagram illustrating an operation of the shift register 210L when scanning is halted halfway. Here, it is assumed that an idle period (period from a point of time t31 to a point of time t32) is provided between when the scan signal G(n−1) goes to a high level and when the scan signal G(n) goes to the high level.

During a period before the point of time t31, the scan signals G sequentially go to a high level as illustrated in FIG. 18. At the point of time t31, clock operations of the gate clock signals CK1 to CK4 are halted. A potential of the charge holding node in each unit circuit 2 is maintained in a level immediately before the point of time t31 during the idle period (the period from a point of time t31 to a point of time t32). In the example illustrated in FIG. 18, potentials of the charge holding nodes N1(n−2), N1(n−1), N1(n), and N1(n+1) are maintained in the high level during the idle period. As illustrated in FIG. 18, the control signal VTP is maintained in the high level during the idle period. Thereby, during an idle period, all the unit circuits 2 maintain the thin film transistors T9o and T9e in an ON state, and all the scan signals G are maintained in the low level. In FIG. 18, the control signal VTP is in the high level during the entire period of the idle period, but the control signal VTP may be set to the nigh level in part of the idle period.

At the point of time t32, clock operations of the gate clock signals CK1 to CK4 restart. Thereby, a potential of the charge holding node N1(n) increases greatly (the charge holding node N1(n) is bootstrapped), and the scan signal G(n) goes to a high level. By doing so, scanning of the gate bus line GL restarts from the nth row.

2.5 Countermeasure Against Leakage of Charges

Also in the present embodiment, the gate lengths of the thin film transistors T6o and T6e of the charge holding node turn-off transistors provided in the unit circuit 2 are larger than the gate lengths of the other charge holding node turn-off transistors, in the same manner as in the first embodiment.

2.6 Effect

Also in the present embodiment, the gate driver 200 capable of halting the scanning halfway while suppressing expansion of a frame size is realized in the same manner as in the first embodiment. According to the present embodiment, since the respective gate bus lines GL are driven by both the one end side and the other end side, a display defect due to a waveform dullness of the scan signal G is not generated.

3. Third Embodiment

Figure 19:
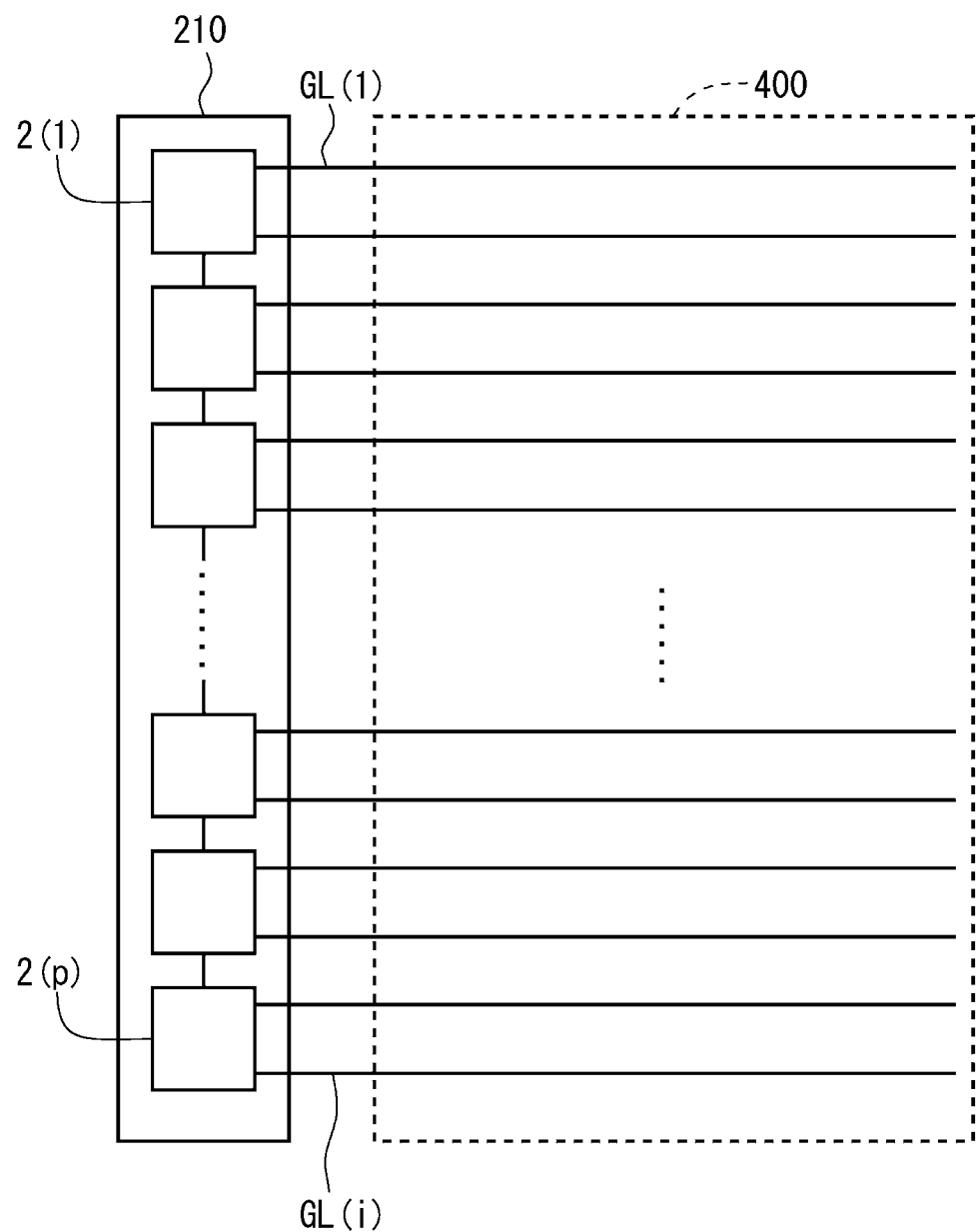
FIG. 19 is a block diagram illustrating a schematic configuration of a gate driver according to a third embodiment.

FIG. 19 is a block diagram illustrating a schematic configuration of the gate driver 200 according to the present embodiment. The gate driver 200 according to the present embodiment is configured with the shift register 210 disposed on one end side of the display unit 400. The shift register 210 is configured with p unit circuits 2(1) to 2(p). Symbol p denotes i/2. The respective unit circuits 2 are connected to two gate bus lines GL.

As understood from. FIGS. 14 and 19, in the second embodiment, the respective gate bus lines GL(1) to GL(i) are driven by both one end side and the other end side, and in contrast to this, in the present embodiment, the respective gate bus lines GL(1) to GL(i) are driven only by one end side. Since only this point is different between the second embodiment and the present embodiment, descriptions on the configuration of the shift register, the configuration of the unit circuit, and the operation of the gate driver will be omitted.

Regarding a countermeasure against a leakage of charges, also in the present embodiment, the gate lengths of the thin film transistors T6o and T6e of the charge holding-node turn-off transistors provided in the unit circuit 2 (see FIG. 7) are larger than the gate lengths of other charge holding node turn-off transistors.

As such, also in the present embodiment, the gate driver 200 capable of halting the scanning halfway while suppressing expansion of a frame size is realized in the same manner as in the first embodiment. According to the present embodiment, since the shift register 210 is provided only on one end side of the display unit 400, it is possible to reduce the frame size.

4. Fourth Embodiment 4.1 Schematic Configuration of Gate Driver

Figure 20:
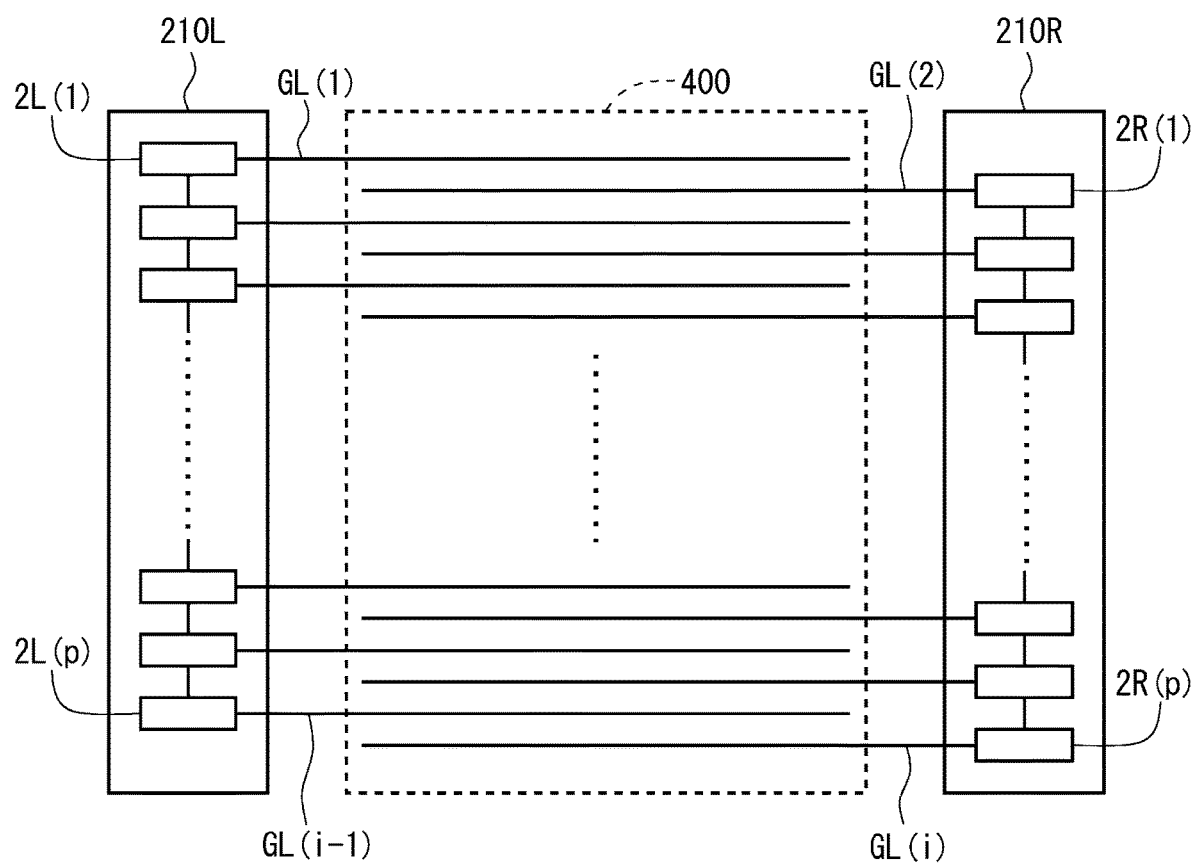
FIG. 20 is a block diagram illustrating a schematic configuration of a gate driver according to a fourth embodiment.

FIG. 20 is a block diagram, illustrating a schematic configuration of the gate driver 200 according to the present embodiment. The gate driver 200 according to the present embodiment includes the shift register 210L disposed on one end side of the display unit 400 and the shift register 210R disposed on the other end side of the display unit 400. In the display unit 400, i display bus lines GL(1) to GL(i) are arranged, the shift register 210L drives the gate bus lines GL in the odd-numbered rows, and the shift register 210R drives the gate bus line GL in the even-numbered rows. That is, in the present embodiment, the gate bus lines GL(1) to GL(i) are driven by a drive method called "comb drive" or "interlace drive" in the same manner as in the first embodiment.

The shift register 210L is configured with p unit circuits 2L(1) to 2L(p), and the shift register 210R is configured with p unit circuits 2R(1) to 2R(p), Symbol p denotes i/2. In the present embodiment, each unit circuit 2 is connected to one gate bus line GL unlike the first to third embodiments. If q is assumed to be an integer greater than or equal to 1 and smaller than or equal to p, the unit circuit 2L(q) in the shift register 210L is connected to the gate bus line GL(2q−1), and the unit circuit 2L(q) in the shift register 210R is connected to the gate bus line GL(2q).

4.2 Configuration of Shift Register

Figure 21:
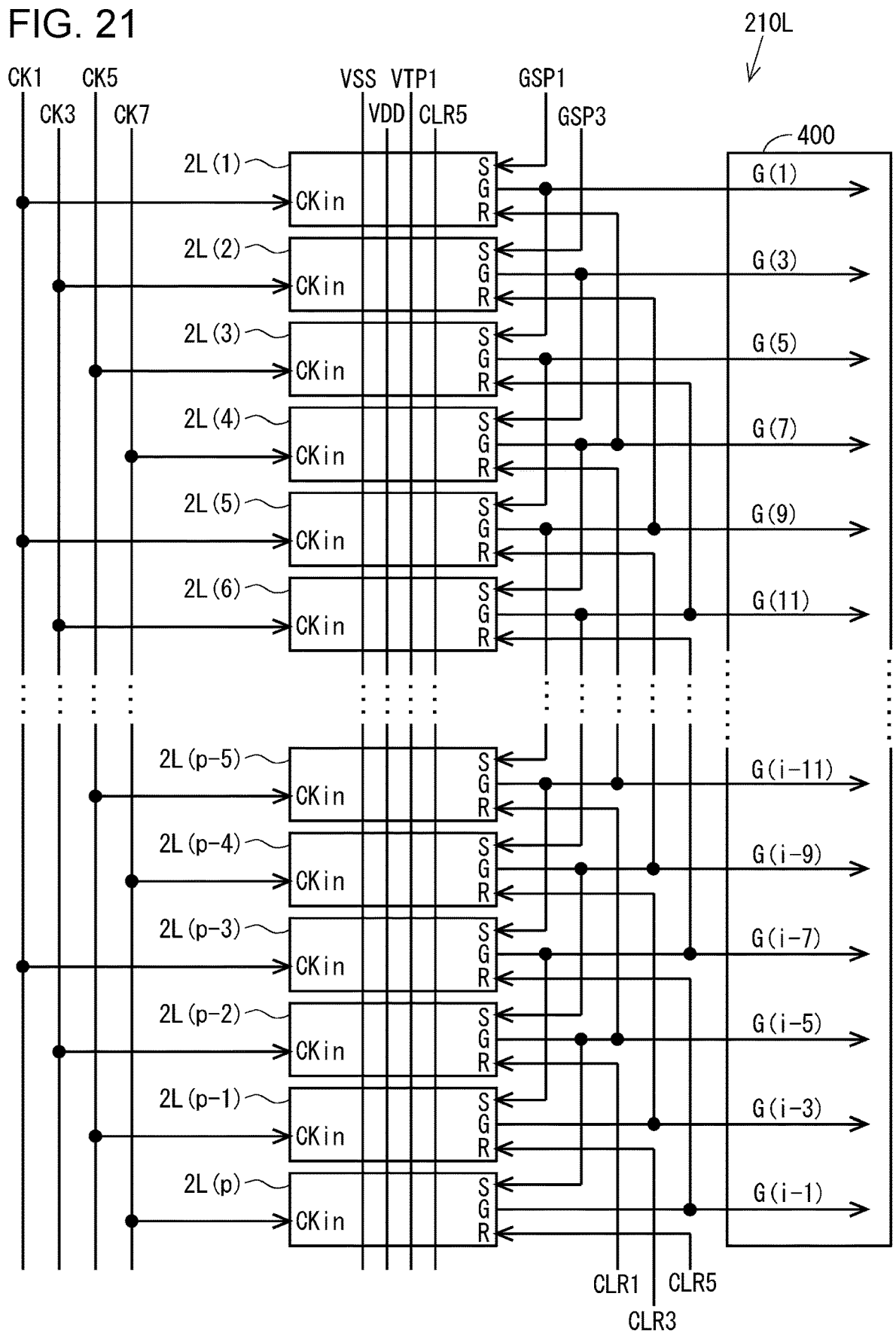
FIG. 21 is a block diagram illustrating a configuration of a shift register disposed on one end side of a display unit, in the fourth embodiment.
Figure 22:
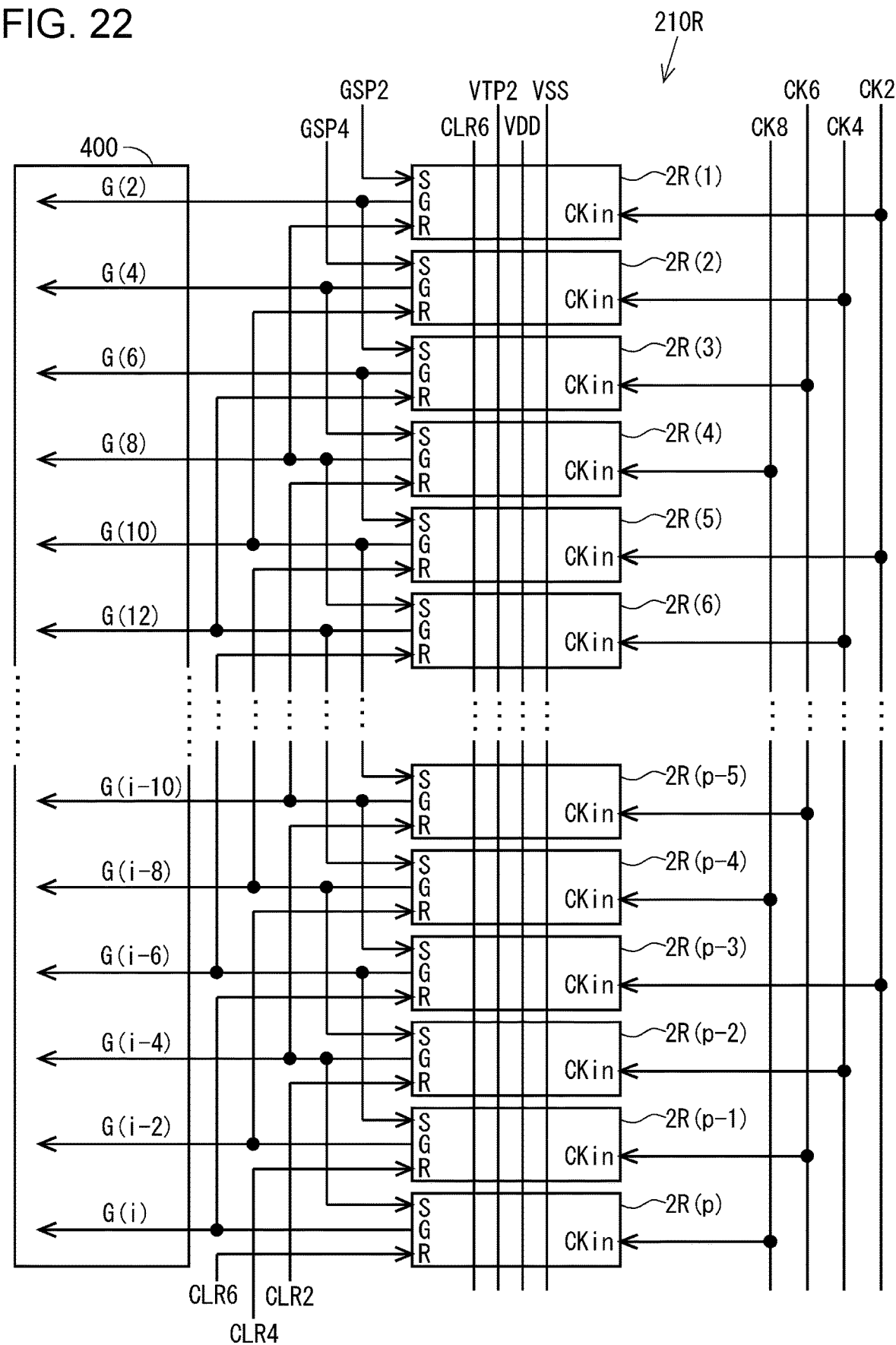
FIG. 22 is a block diagram illustrating a configuration of another shift register disposed on the other end side of the display unit, in the fourth embodiment.

FIG. 21 is a block diagram illustrating a configuration of the shift register 210L. FIG. 22 is a block diagram illustrating a configuration of the shift register 210R. As described above, the shift register 210L is configured with the p unit circuits 2L(1) to 2L(p), and the shift register 210R is configured with the p unit circuits 2R(1) to 2R(p).

The gate start pulse signals GSP1 and GSP3, the clear signals CLR1, CLR3, and CLR5, the gate clock signals CK1, CK3, CK5, and CK7, and the control signal VTP1 are applied to the shift register 210L as the gate control signal GCTL. The gate start pulse signals GSP2 and GSP4, the clear signals CLR2, CLR4, and CLR6, the gate clock signals CK2, CK4, CK6, and CK8, and the control signal VTP2 are applied to the shift register 210R as the gate control signal GCTL. The shift registers 210L and 210R are also supplied with the high-level DC power supply voltage VDD and the low-level DC power supply voltage VSS. The gate clock signals CK1 to CK8 are eight-phase clock signals. Hereinafter, only the configuration of the shift register 210L will be described, and description on the configuration of the shift register 210R will be omitted.

In the shift register 210L, the signals applied to the respective unit circuits 2 are as follows (see FIG. 21). The gate clock signal CK1 is applied to the unit circuit 2L(1) as an input clock signal CKin, the gate clock signal CK3 is applied to the unit circuit 2L(2) as the input clock signal CKin, the gate clock signal CK5 is applied to the unit circuit 2L(3) as the input clock signal CKin, and the gate clock signal CK7 is applied to the unit circuit 2L(4) as the input clock signal CKin. This configuration is repeated for an input of the gate clock signal to the unit circuit 2. The output signal G output from the unit circuit 2L(q−2) is applied to the unit circuit 2L(q) in a certain stage (here, assumed to be a qth stage) as the set signal S, and the output signal G output from the unit circuit 2L(q+3) is applied to the unit circuit 2L(q) as the reset signal R. However, the gate start pulse signal GSP1 is applied to the unit circuit 2L(1) as the set signal S, the gate start pulse signal GSP3 is applied to the unit circuit 2L(2) as the set signal S, the clear signal CLR1 is applied to the unit circuit 2L(p−2) as the reset signal R, the clear signal CLR3 is applied to the unit circuit 2L(p−1) as the reset signal R, and the clear signal CLR5 is applied to the unit circuit 2L(p) as the reset signal R. The DC power supply voltage VSS, the DC power supply voltage VDD, the control signal VTP1, and the clear signal CLR5 are commonly applied to all the unit circuits 2.

The output signal G is output from the respective unit circuits 2 of the shift register 210L. The output signal G output from the unit circuit 2L(q) in a certain stage (here, assumed to be a qth stage) is applied to the gate bus line GL(2q−1) as the scan signal G(2q−1), is applied to the unit circuit 2L(q−3) as the reset signal R, and is applied to the unit circuit 2L(q+2) as the set signal S. However, the output signals G output from the unit circuits 2L(1) to 2L(3) are not applied to other unit circuits as the reset signal R, and the output signals G output from the unit circuits 2L(p−1) and 2L(p) are not applied to the other unit circuits as the set signal S.

4.3 Configuration of Unit Circuit

Figure 23:
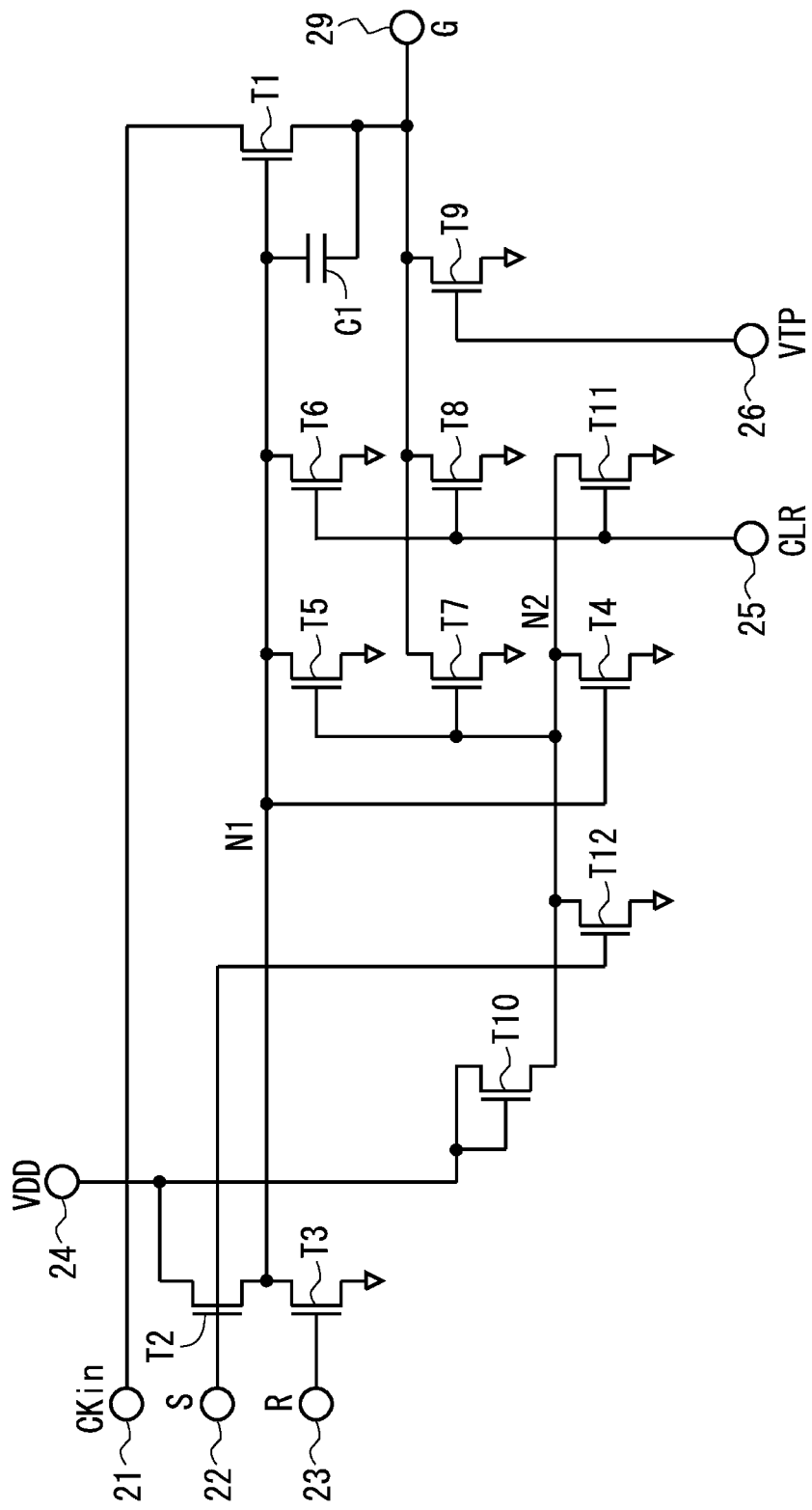
FIG. 23 is a circuit diagram illustrating a configuration of a unit circuit according to the fourth embodiment.

FIG. 23 is a circuit diagram illustrating a configuration of the unit circuit 2 according to the present embodiment. As illustrated in FIG. 23, the unit circuit 2 includes 12 thin film transistors T1 to T12 and one capacitor (capacitance element) C1. In addition to the input terminal for the DC power supply voltage VSS, the unit circuit 2 includes six input terminals 21 to 26 and one output terminal 29. Here, the input terminal for receiving the input clock signal CKin is denoted by a reference numeral 21, the input terminal for receiving the set signal S is denoted by a reference numeral 22, the input terminal for receiving the reset signal R is denoted by a reference numeral 23, the input terminal for receiving the DC power supply voltage VDD is denoted by a reference numeral 24, the input terminal for receiving the clear signal CLR is denoted by a reference numeral 25, and the input terminal for receiving the control signal VTP is denoted by a reference numeral 26. An output terminal for outputting the output signal G is denoted by a reference numeral 29. The clear signal CLR in FIG. 23 corresponds to the clear signal CLR5 in FIG. 21, and the control signal VTP in FIG. 23 corresponds to the control signal VTP1 in FIG. 21.

The thin film transistors T1 to T11 correspond to the thin film transistors T1o to T9o, T10, and T11 according to the first embodiment (see FIG. 7), and the capacitor C1 corresponds to the capacitor C1o according to the first embodiment. Thus, description on a connection relation between the configuration elements and functions of the respective configuration elements will be omitted. In the unit circuit 2 according to the present embodiment, a thin film transistor T12 having a gate terminal connected to the input terminal 22, a drain terminal connected to the stabilization node N2, and a source terminal connected to the input terminal for the DC power source voltage VSS is provided as a component not provided in the unit circuit 2 in the first embodiment. The thin film transistor T12 changes a potential of the stabilization node N2 toward a low level when the set signal S is in a high level.

4.4 Operation of Gate Driver

Next, an operation of the gate driver 200 will be described. First, an operation when scanning is not halted halfway will be described, and then, an operation when the scanning is halted halfway will be described.

4.4.1 Operation when Scanning is not Halted Halfway

Figure 24:
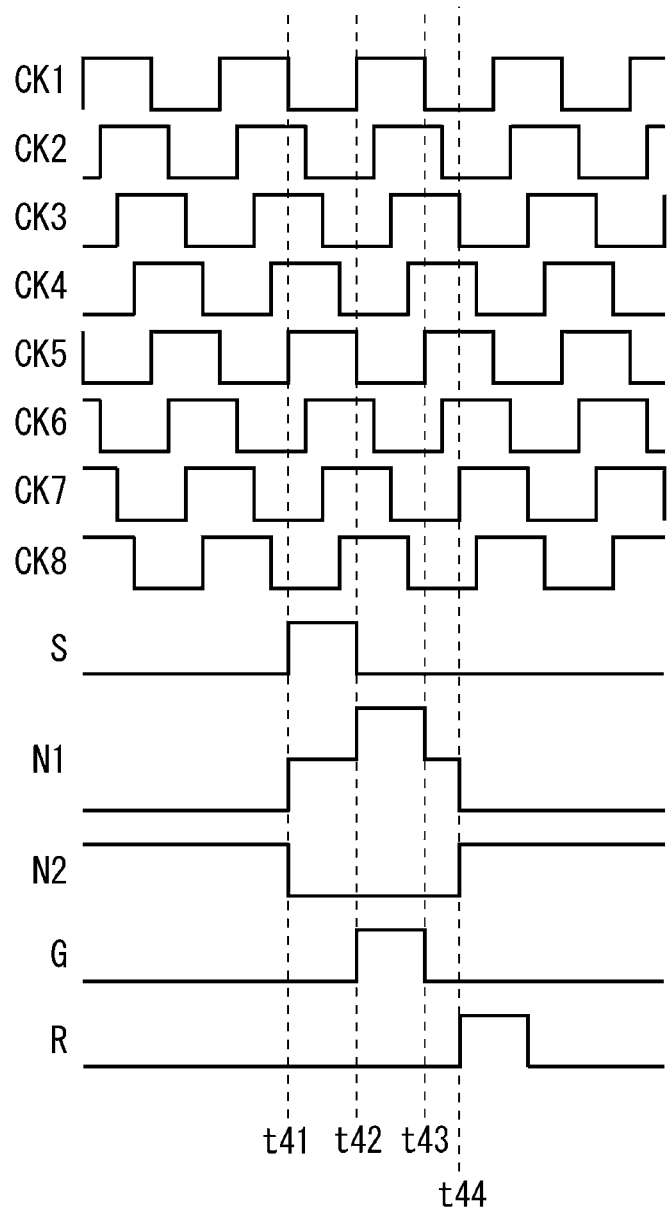
FIG. 24 is a signal waveform diagram illustrating an operation of a unit circuit when scanning is not halted halfway, in the fourth embodiment.

FIG. 24 is a signal waveform diagram illustrating an operation of one unit circuit 2 when scanning is not halted halfway. It is assumed that the gate clock signal CK1 is input to the unit circuit 2 which will be described here as the input clock signal CKin.

During a period before a point of time t41, the set signal S goes to a low level, a potential of the charge holding node N1 is the low level, a potential of the stabilization node N2 goes to a high level, the output signal G goes to the low level, and the reset signal R goes to the low level. In the input clock signal CKin (gate clock signal CK1), the high level and the low level are alternately repeated. Since there is a parasitic capacitance in the thin film transistor T1 in the unit-circuit 2, a potential of the charge holding node N1 may change due to a clock operation of the input clock signal CKin and existence of the parasitic capacitance of the thin film transistor T1 in the period before the point of time t41. However, a potential of the stabilization node N2 is maintained in a high level during the period before the point of time t41 in the same manner as in the first embodiment, and thus, an abnormal operation due to the clock operation of the input clock signal CKin may not be performed.

At the point of time t41, the set signal S changes from the low level to the high level. Accordingly, the thin film transistors T2 and T12 are turned on. As the thin film transistor 112 is turned on, the potential of the stabilization node N2 goes to the low level. As the thin film transistor T2 is turned on, the capacitor C1 is charged. Thereby, the potential of the charge holding node N1 changes from the low level to the high level, and the thin film transistor T1 is turned on. However, since the input clock signal CKin (gate clock signal CK1) is in the low level at the point of time t41, the output signal G is maintained in the low level.

At the point of time t42, the input clock signal CKin (gate clock signal CK1) changes from the low level to the high level. At this point of time, since the thin film transistor T1 is in an ON state, a potential of the output terminal 29 increases as a potential of the input terminal 21 increases. Here, as illustrated in FIG. 23, since the capacitor C1 is provided between the charge holding node N1 and the output terminal 29, the potential of the charge holding node N1 increases as the potential of the output terminal 29 increases (the charge holding node N1 is bootstrapped). As a result, a large voltage is applied to the gate terminal of the thin film transistor T1, and a potential of the output signal G increases to a level sufficient for the gate bus line GL connected to the output terminal 29 to be in a selected state.

At a point of time t43, the input clock signal CKin (gate clock signal CK1) changes from a high level to a low level. Thereby, the potential of the output terminal 29 (the potential of the output signal G) decreases as the potential of the input terminal 21 decreases. If the potential of the output terminal 29 decreases, the potential of the charge holding node N1 also decreases via the capacitor C1.

At a point of time t44, the reset signal R changes from the low level to the high level. Thereby, the thin film transistor T3 is turned on. As a result, the potential of the charge holding node N1 decreases to the low level. Thereby, the thin film transistor T4 is turned off, and the potential of the stabilization node N2 changes from the low level to the high level. As a result, the thin film transistor T7 is turned on, and the potential of the output terminal 29 (the potential of the output signal G) goes to the low level.

As the above-described operations are performed in each unit circuit 2, the plurality of gate bus lines GL(1) to GL(i) provided in the liquid crystal display device are sequentially selected, and writing to the pixel capacitances is successively performed.

In the same manner as in the first embodiment, the clear signal CLR goes to the high level after scanning all the gate bus lines GL is completed. Thereby, states of all the unit circuits 2 are reset.

4.4.2 Operation when Scanning is Halted Halfway

Figure 25:
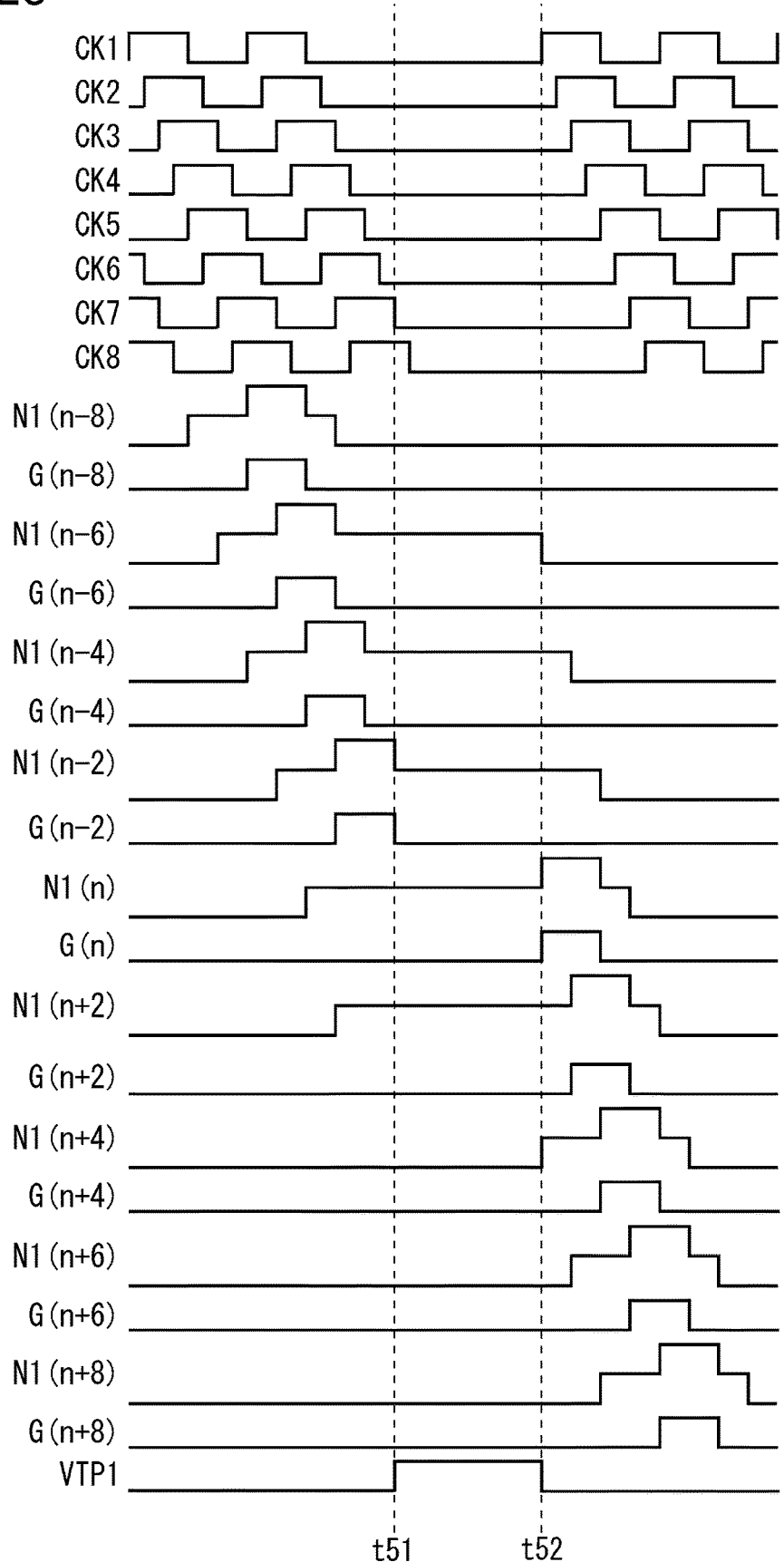
FIG. 25 is a signal waveform diagram illustrating an operation of the shift register (shift register disposed on one end side of the display unit) when the scanning is halted halfway, in the fourth embodiment.

FIG. 25 is a signal waveform diagram illustrating an operation of the shift register 210L when scanning is halted halfway. Here, it is assumed that an idle period (a period from points of time t51 to t52) is provided between when the scan signal G(n−2) goes to a high level and when the scan signal G(n) goes to the high level.

During a period before the point time t51, the scan signals G sequentially go to the high level as illustrated in FIG. 25. At the point of time t51, clock operations of the gate clock signals CK1 to CK8 are halted. Potentials of the charge holding nodes in the respective unit circuits 2 are maintained in a level immediately before the point of time t51 during the idle period (the period from points of time t51 to t52). In the example illustrated in FIG. 25, the potentials of the charge holding nodes N1(n−6), N1(n−4), N1(n−2), N1(n), and N1(n+2) are maintained in the high level during the idle period. As illustrated in FIG. 25, the control signal VTP1 is maintained in the high level during the idle period. Thereby, during the idle period, the thin film transistor T9 is maintained in an ON state in all the unit circuits 2, and all the scan signals G are maintained in the low level. In FIG. 25, the control signal VTP1 is in the high level during the entire period of the idle period, but the control signal VTP1 may be in the nigh level in part of the idle period.

At the point of time t52, clock operations of the gate clock signals CK1 to CK8 restart. Thereby, the potential of the charge holding node N1(n) increases greatly (the charge holding node N1(n) is bootstrapped), and the scan signal G(n) goes to a high level. By doing so, scanning of the gate bus lines GL restarts from the nth row.

4.5 Countermeasure Against Leakage of Charges

Regarding a countermeasure against a leakage of charges, in the present embodiment, the gate length of the thin film transistor T6 of the charge holding node turn-off transistors provided in the unit circuit 2 is larger than the gate lengths of other charge holding node turn-off transistors (thin film transistors T3 and T5).

4.6 Effect

Also in the present embodiment, the gate driver 200 capable of halting the scanning halfway while suppressing expansion of a frame size is realized in the same manner as in the first embodiment.

4.7 Modification Example

4.7.1 First Modification Example

Figure 26:
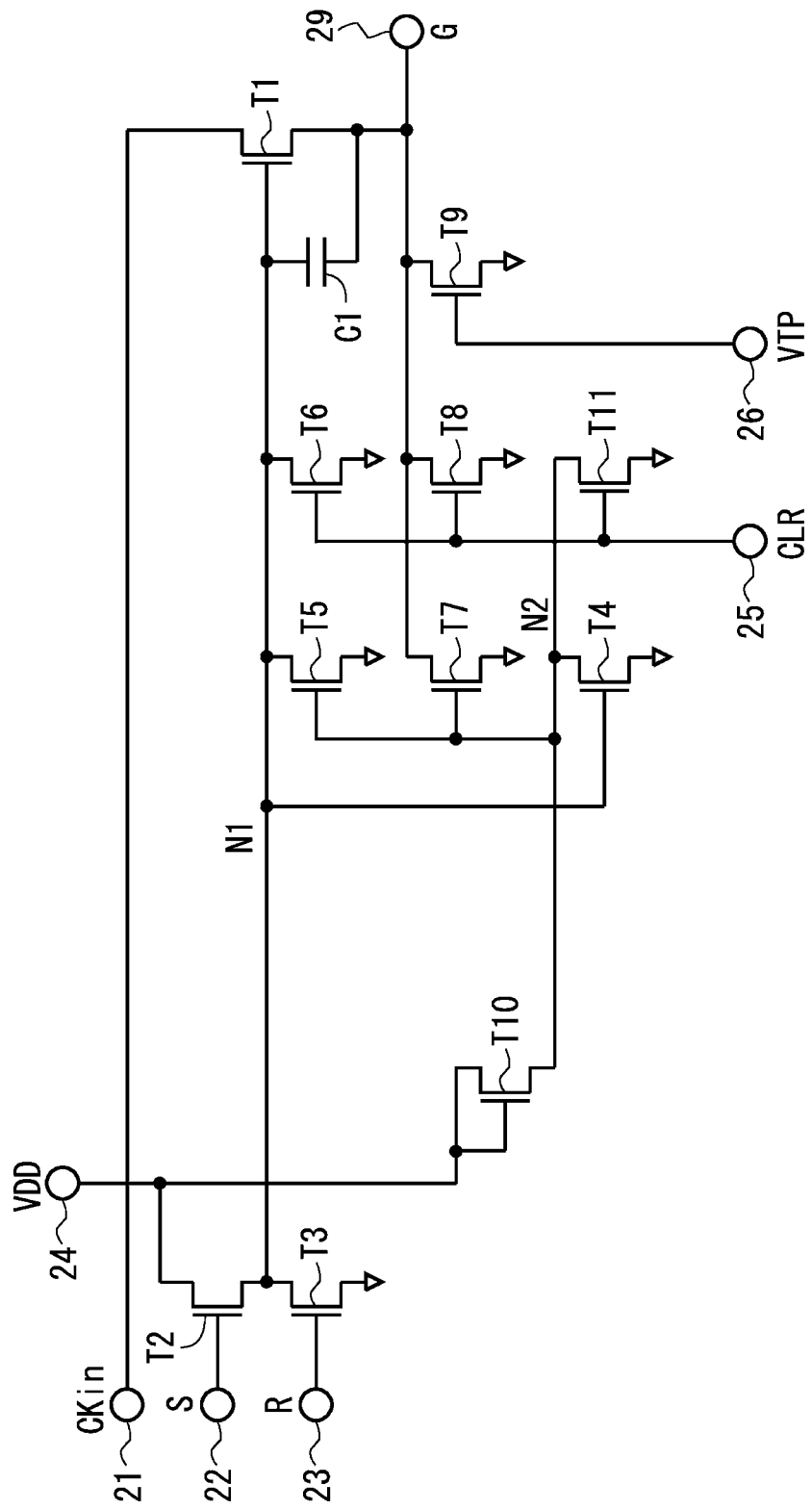
FIG. 26 is a circuit diagram illustrating a configuration of a unit circuit according to a first modification example of the fourth embodiment.

FIG. 26 is a circuit diagram, illustrating a configuration of the unit circuit 2 according to a first modification example of the fourth embodiment. In the fourth embodiment, the thin film transistor T12 (see FIG. 23) for changing the potential of the stabilization node N2 toward the low level, when the set signal S is in the high level, is provided, but in the modification example, the thin film transistor T12 is not provided.

As illustrated in FIG. 24, a potential of the charge holding node N1 changes from a low level to a high level at the point of time t41, and thereby, a potential of the stabilization node N2 changes from the high level to the low level as the thin film transistor T4 is turned on. Accordingly, the thin film transistor T12 does not have to be provided, and thus, a configuration (see FIG. 26) according to the present modification example may also be adopted. Thereby, it is possible to reduce a frame size as compared with the fourth embodiment. Also in a fifth embodiment and a sixth embodiment, the configuration illustrated in FIG. 26 may be adopted as the configuration of the unit circuit 2.

4.7.2 Second Modification

Figure 27:
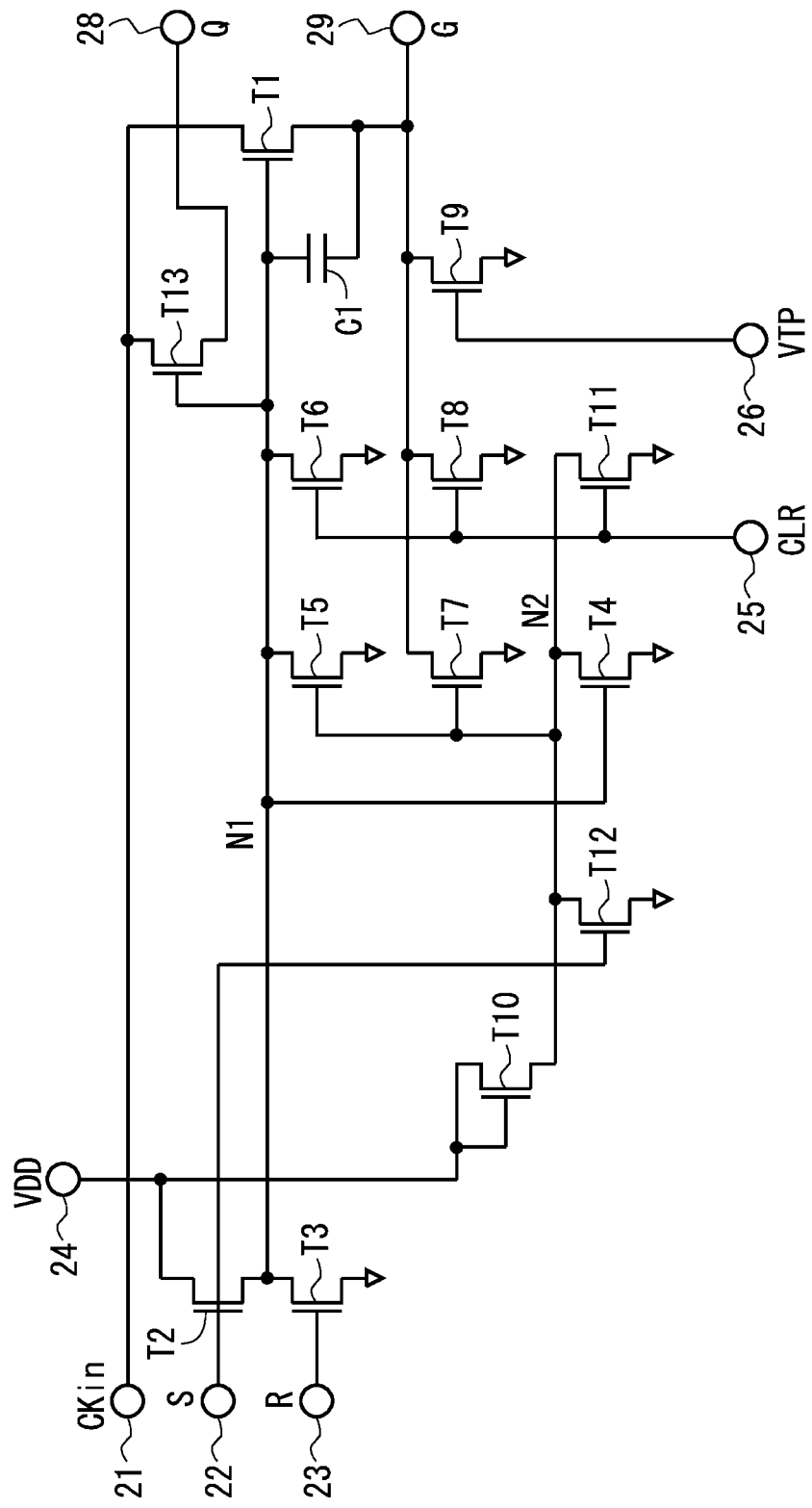
FIG. 27 is a circuit diagram illustrating a configuration of a unit circuit according to a second modification example of the fourth embodiment.

FIG. 27 is a circuit diagram illustrating a configuration of the unit circuit 2 according to a second modification example of the fourth embodiment. In the unit circuit 2 according to the present modification example, in addition to the configuration elements according to the fourth embodiment, a thin film transistor 113 is provided. In the thin film transistor T13, a gate terminal is connected to the charge holding node N1, a drain terminal is connected to the input terminal 21, and a source terminal is connected to the output terminal 28. Since the thin film transistor T13 has the same configuration as the thin film transistor T1 except for a delay of a waveform, a signal which is the same as the signal output from the output terminal 29 is output from the output terminal 28. Therefore, in the present modification example, focusing on the unit circuit 2L(q) in a certain stage (here, assumed to be a qth stage) in the shift register 210L, an output signal G output from the output terminal 29 is applied to the gate bus line GL(2q−1) as the scan signal G(2q−1), and an output signal Q output from the output terminal 28 is applied to the unit circuit 2L(q−3) as the reset signal R and is also applied to the unit circuit 2L(q+2) as the set signal S. Focusing on the unit circuit 2R(q) in the certain stage (here, assumed to be the qth stage) in the shift register 210R, the output signal G output from the output terminal 29 is applied to the gate bus line GL(2q) as the scan signal G(2q), and the output signal Q output from the output terminal 28 is applied to the unit circuit 2R(q−3) as the reset signal R and is also applied to the unit circuit 2R(q+2) as the set signal S. According to the configuration, a load on the output signal from each unit circuit 2 is dispersed, and thus, an operation of the gate driver 200 may be stabilized. Also in the fifth embodiment and the sixth embodiment, the configuration illustrated in FIG. 27 may be adopted as the configuration of the unit circuit 2.

5. Fifth Embodiment

5.1 Schematic Configuration of Gate Driver

Figure 28:
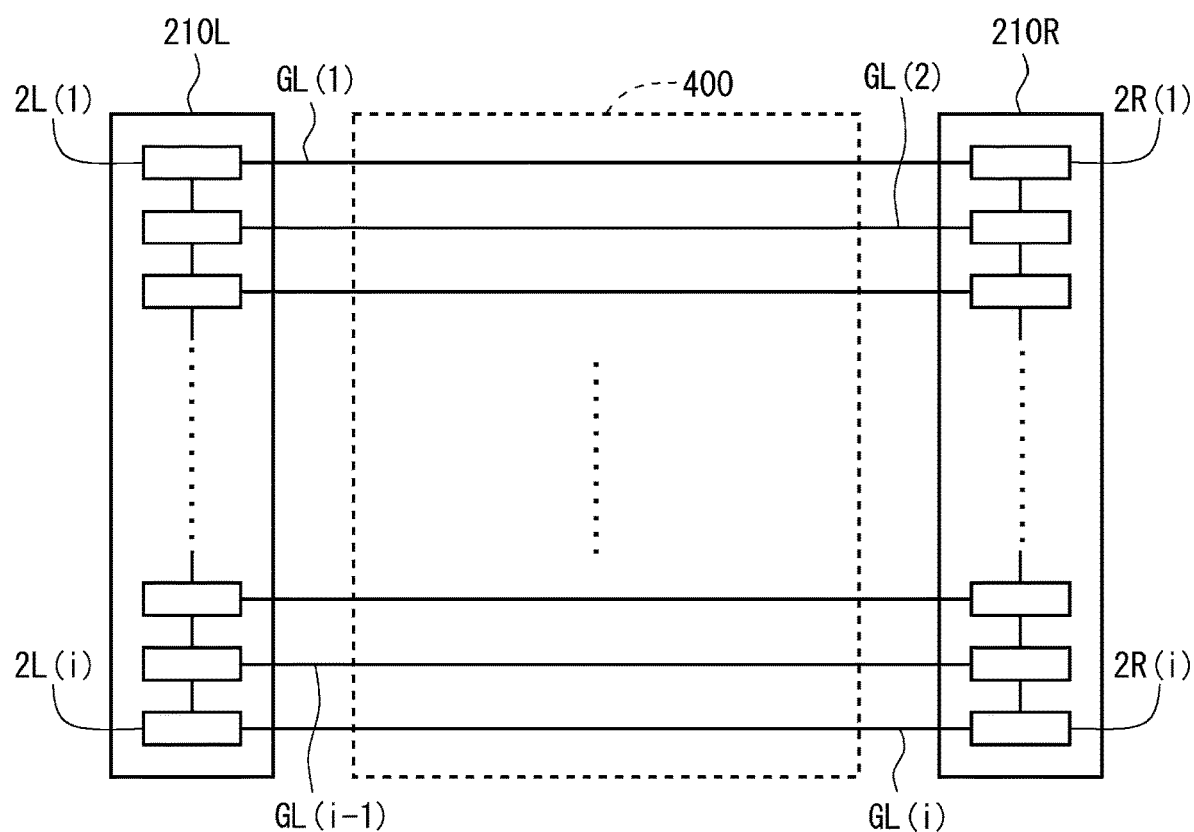
FIG. 28 is a block diagram illustrating a schematic configuration of a gate driver according to a fifth embodiment.

FIG. 28 is a block diagram illustrating a schematic configuration of the gate driver 200 according to the present embodiment. The gate driver 200 according to the present embodiment is configured with the shift register 210L disposed on one end side of the display unit 400 and the shift register 210R disposed on the other end side of the display unit 400 in the same manner as in the fourth embodiment. In the present embodiment, the respective gate bus lines GL(1) to GL(i) are driven by both the shift register 210L and the shift register 210R unlike the fourth embodiment (in the same manner as in the second embodiment).

The shift register 210L is configured with i unit circuits 2L(1) to 2L(i), and the shift register 210R is configured with i unit circuits 2R(1) to 2R(i). In the same manner as in the fourth embodiment, the respective unit circuits 2 are connected to one gate bus line GL.

5.2 Configuration of Shift Register

Figure 29:
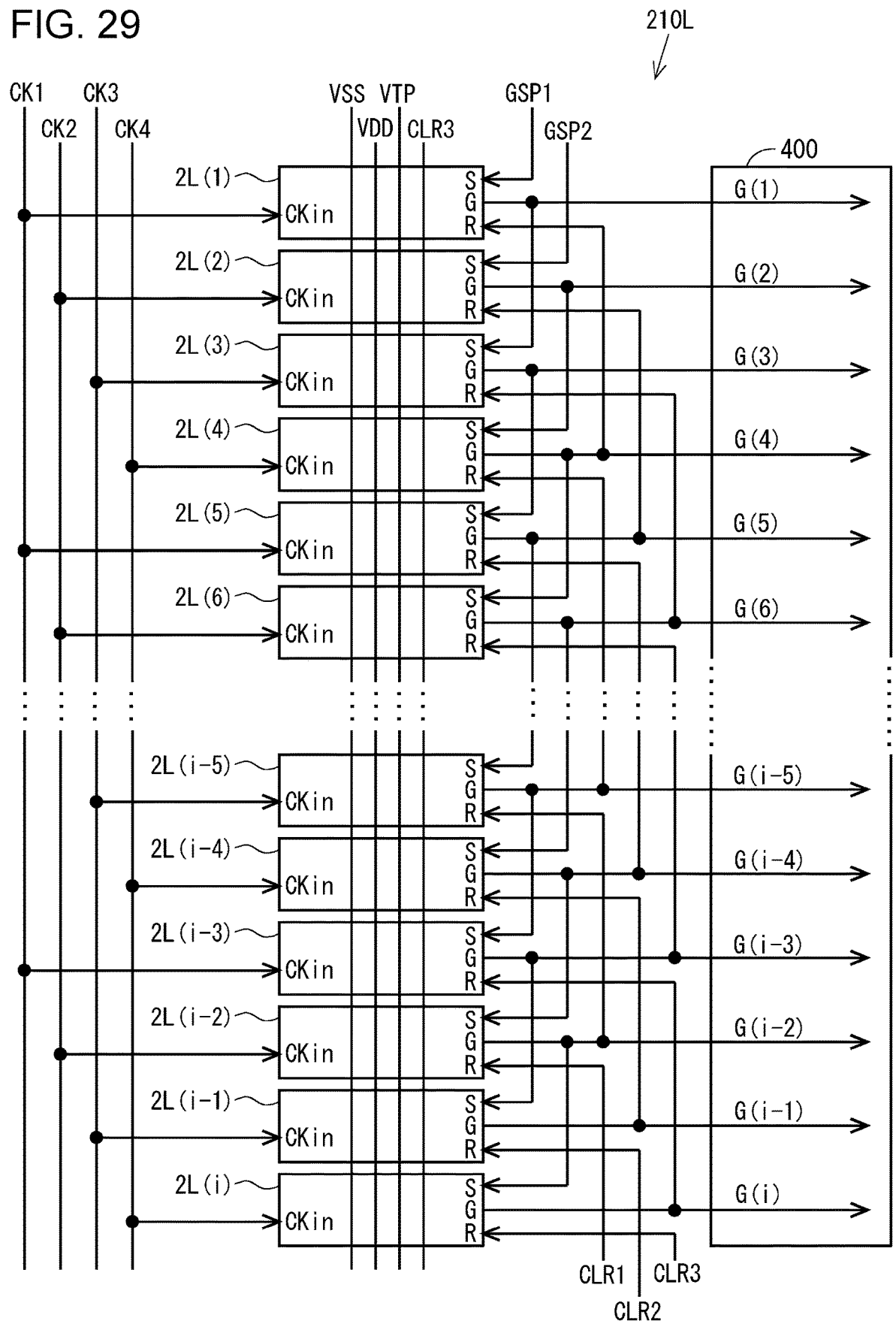
FIG. 29 is a block diagram illustrating configuration of a shift register disposed on one end side of a display unit, in the fifth embodiment.
Figure 30:
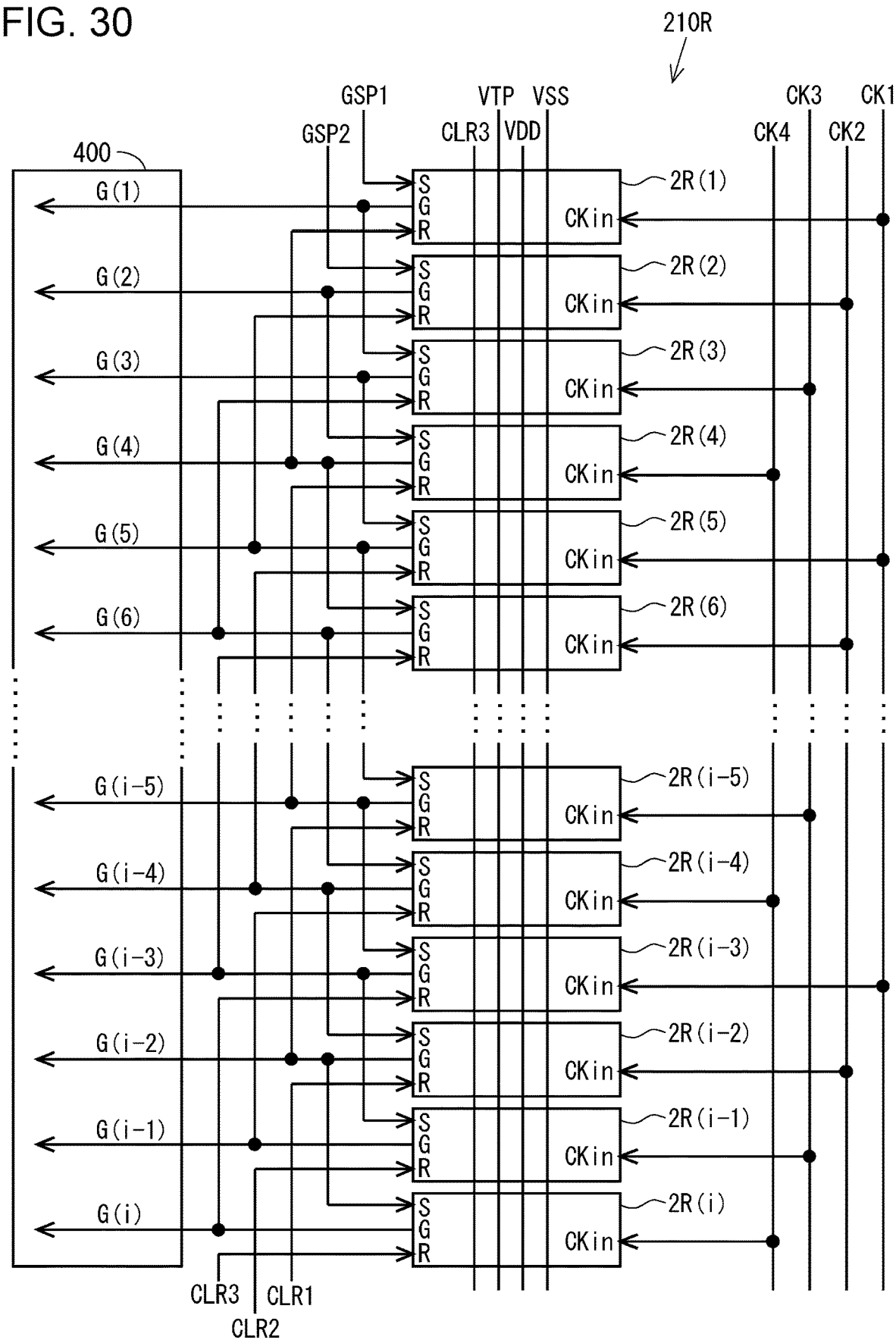
FIG. 30 is a block diagram illustrating a configuration of a shift register disposed on the other end side of the display unit, in the fifth embodiment.

FIG. 29 is a block diagram illustrating a configuration of the shift register 210L. FIG. 30 is a block diagram illustrating a configuration of the shift register 210R. In the present embodiment, the same signal is input to the shift register 210L and the shift register 210R. The gate start pulse signals GSP1 and GSP2, the clear signals CLR1 to CLR3, the gate clock signals CK1 to CK4, and the control signal VTP are applied to the shift registers 210L and 210R, as the gate control signal GCTL. The high-level DC power supply voltage VDD and the low-level DC power supply voltage VSS are also applied to the shift registers 210L and 210R. The gate clock signals CK1 to CK4 are four-phase clock signals. Hereinafter, only the configuration of the shift register 210L will be described, and description on the configuration of the shift register 210R will be omitted.

In the shift register 210L, signals applied to the respective unit circuits 2 are as follows (see FIG. 29). The gate clock signal CK1 is applied to the unit circuit 2L(1) as the input clock signal CKin, the gate clock signal CK2 is applied to the unit circuit 2L(2) as the input clock signal CKin, the gate clock signal CK3 is applied to the unit circuit 2L(3) as the input clock signal CKin, and the gate clock signal CK4 is applied to the unit circuit 2L(4) as the input clock signal CKin. This configuration is repeated for an input of the gate clock signal to the unit circuit 2. The set signal S and the reset signal R are the same as in the fourth embodiment. The DC power supply voltage VSS, the DC power supply voltage VDD, the control signal VTP, and the clear signal CLR3 are commonly applied to all the unit circuits 2.

The output signal G is output from each unit circuit 2 of the shift register 210L. The output signal G output from the unit circuit 2L(q) in a certain stage (here, assumed to be a qth stage) is applied to the gate bus line GL(q) as the scan signal G(q), is applied to the unit circuit 2L(q−3) as the reset signal R, and is applied to the unit circuit 2L(q+2) as the set signal S. However, the output signal G output from the unit circuits 2L(1) to 2L(3) is not applied to the other unit circuits as the reset signal R, and the output signal G output from the unit-circuits 2L(i−1) and 2L(i) is not applied to the other unit circuits as the set signal S.

5.3 Configuration of Unit Circuit

A configuration of the unit circuit 2 is the same as the configuration in the fourth embodiment (see FIG. 23).

5.4 Operation of Gate Driver

5.4.1 Operation when Scanning is not Halted Halfway

Figure 31:
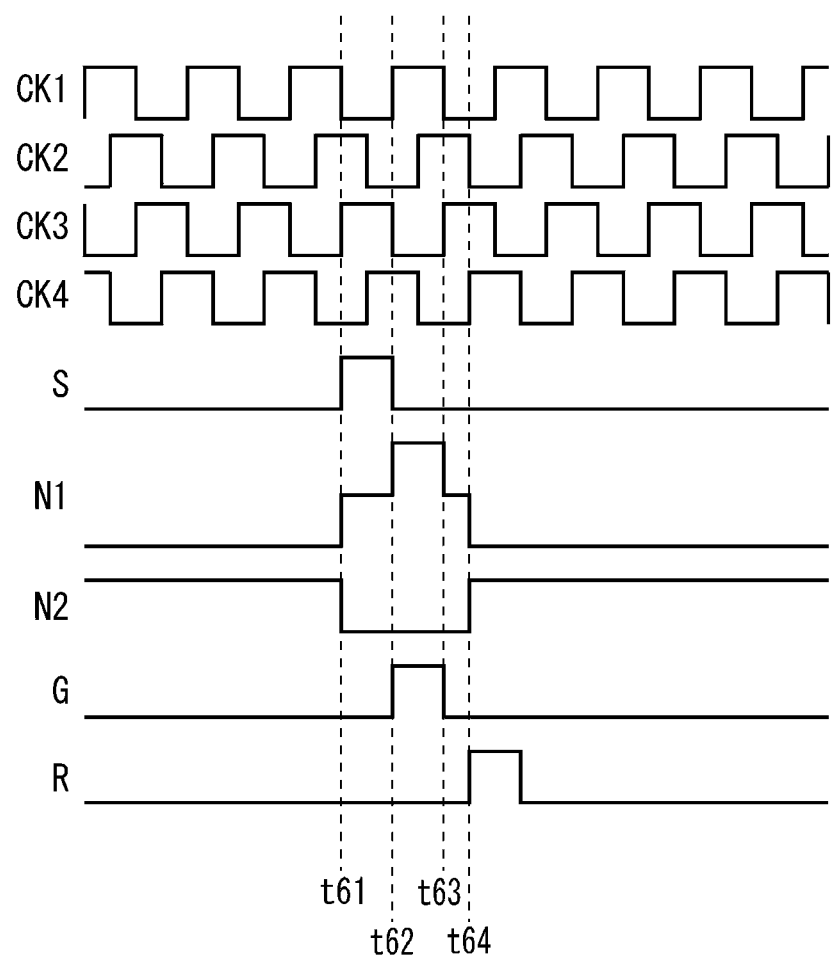
FIG. 31 is a signal waveform diagram illustrating an operation of a unit circuit when scanning is not halted halfway, in the fifth embodiment.

FIG. 31 is a signal waveform diagram illustrating an operation of one unit circuit 2 when scanning is not halted halfway in the present embodiment. As understood from FIGS. 24 and 31, the unit circuit 2 according to the present embodiment operates in a similar manner to the fourth embodiment except that the unit circuit 2 according to the present embodiment operates based on the four-phase gate clock signals CK1 to CK4.

5.4.2 Operation when Scanning is Halted Halfway

Figure 32:
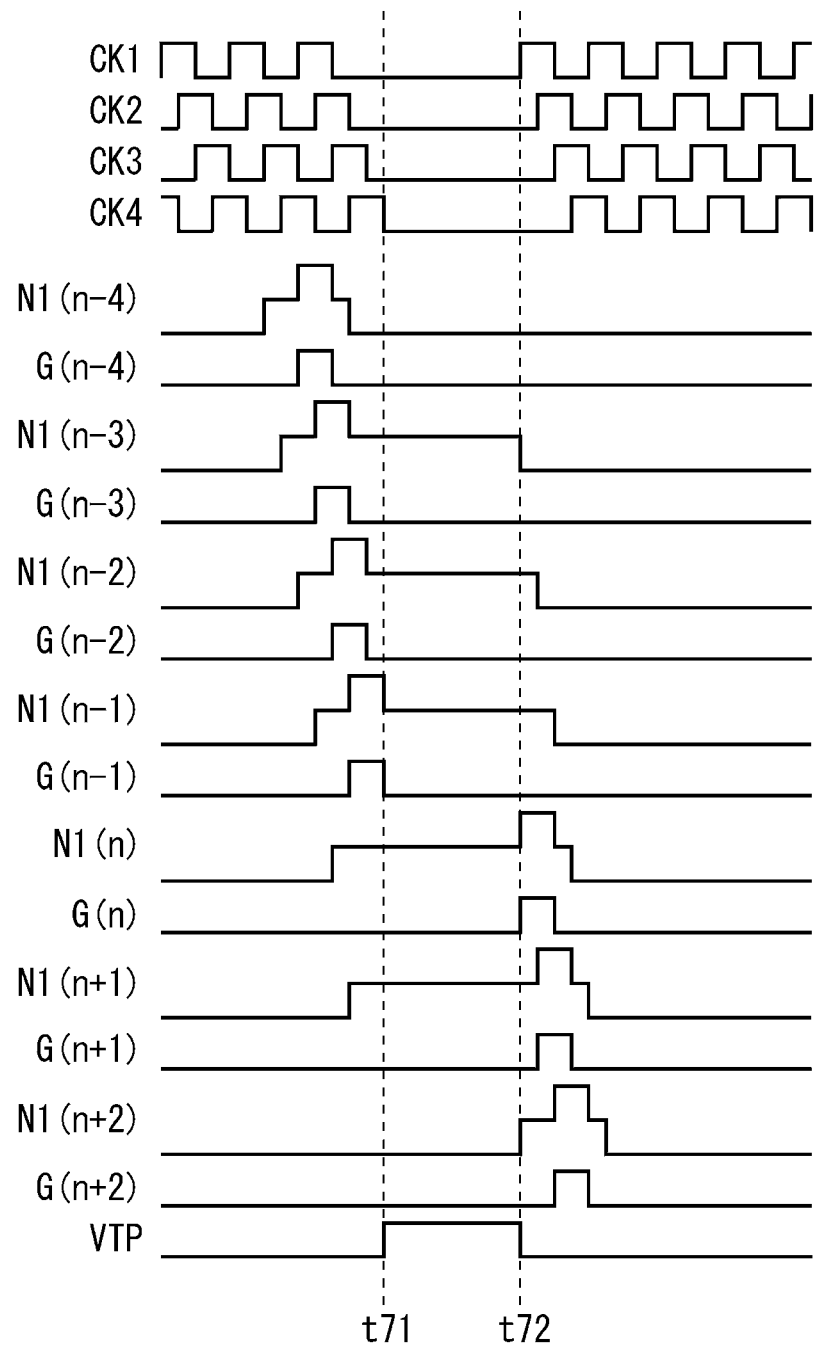
FIG. 32 is a signal waveform diagram illustrating an operation of the shift register (shift register disposed on one end side of the display unit) when the scanning is halted halfway, in the fifth embodiment.

FIG. 32 is a signal waveform diagram illustrating an operation of the shift register 210L when scanning is halted halfway. Here, it is assumed that an idle period (a period from a point of time t71 to a point of time t72) is provided between when the scan signal G(n−1) goes to a nigh level and when the scan signal G(n) goes to the high level.

During a period before the point of time t71, the scan signals G sequentially go to the high level as illustrated in FIG. 32. At the point of time t71, clock operations of the gate clock signals CK1 to CK4 are halted. A potential of a charge holding node in each unit circuit 2 is maintained in a level immediately before the point of time t71 during the idle period (the period from the points of time t71 to t72). In the example illustrated in FIG. 32, the potentials of the charge holding nodes N1(n−3), N1(n−2), N1(n−1), N1(n), and N1(n+1) are maintained in the high level during the idle period. As illustrated in FIG. 32, the control signal VTP is maintained in the high level during the idle period. Thereby, during the idle period, the thin film transistor T9 is maintained in an ON state in all the unit circuits 2, and all the scan signals G are maintained in the low level. In FIG. 32, the control signal VTP is in the high level during the entire period of the idle period, but the control signal VTP may be in the high level in part of the idle period.

At the point of time t72, the clock operations of the gate clock signals CK1 to CK4 restart. Thereby, the potential of the charge holding node N1(n) increases greatly (the charge holding node N1(n) is bootstrapped), and the scan signal G(n) goes to the high level. By doing so, scanning the gate bus line GL restarts from the nth row.

5.5 Countermeasure Against Leakage of Charges

In the present embodiment, the gate length of the thin film transistor T6 of the charge holding node turn-off transistors provided in the unit circuit 2 is larger than the gate lengths of the other charge holding node turn-off transistors in the same manner as in the fourth embodiment.

5.6 Effect

Also in the present embodiment, the gate driver 200 capable of halting the scanning halfway while suppressing expansion of a frame size is realized in the same manner as in the first embodiment. According to the present embodiment, the respective gate bus lines GL are driven by both one end side and the other end side, and thus, display defects due to waveform dullness of the scan signal G may not be generated in the same manner as in the second embodiment.

6. Sixth Embodiment

Figure 33:
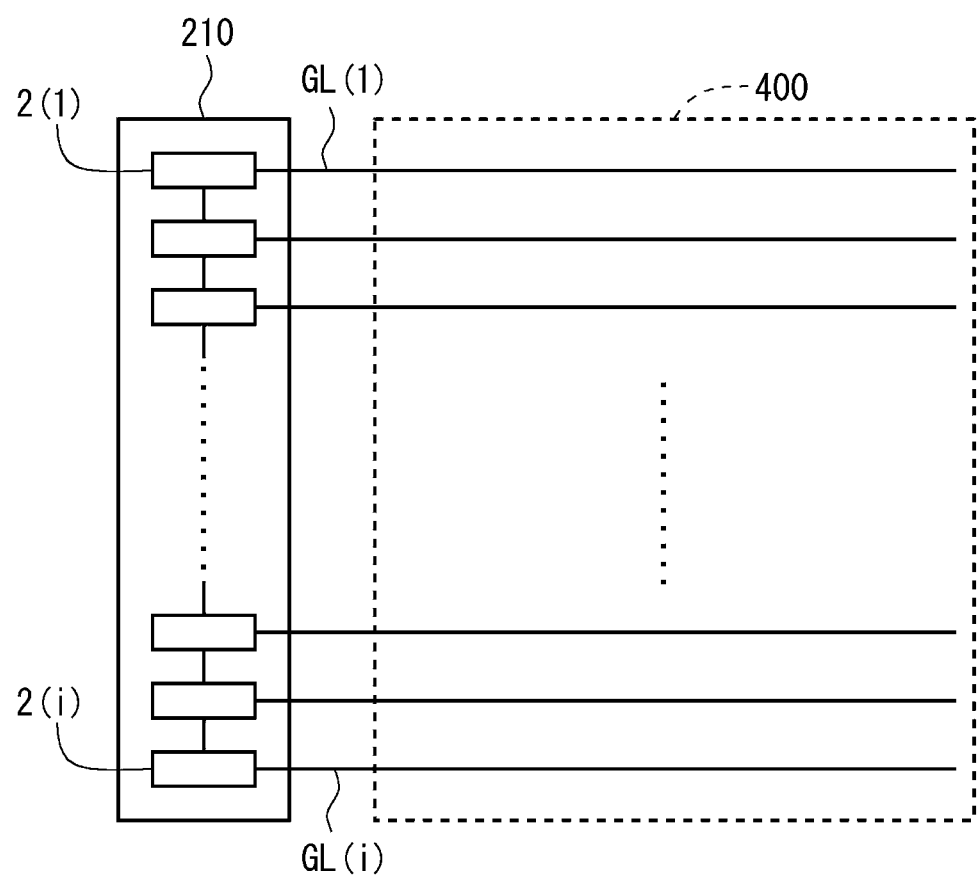
FIG. 33 is a block diagram illustrating a schematic configuration of a gate driver according to a sixth embodiment.
Figure 34:
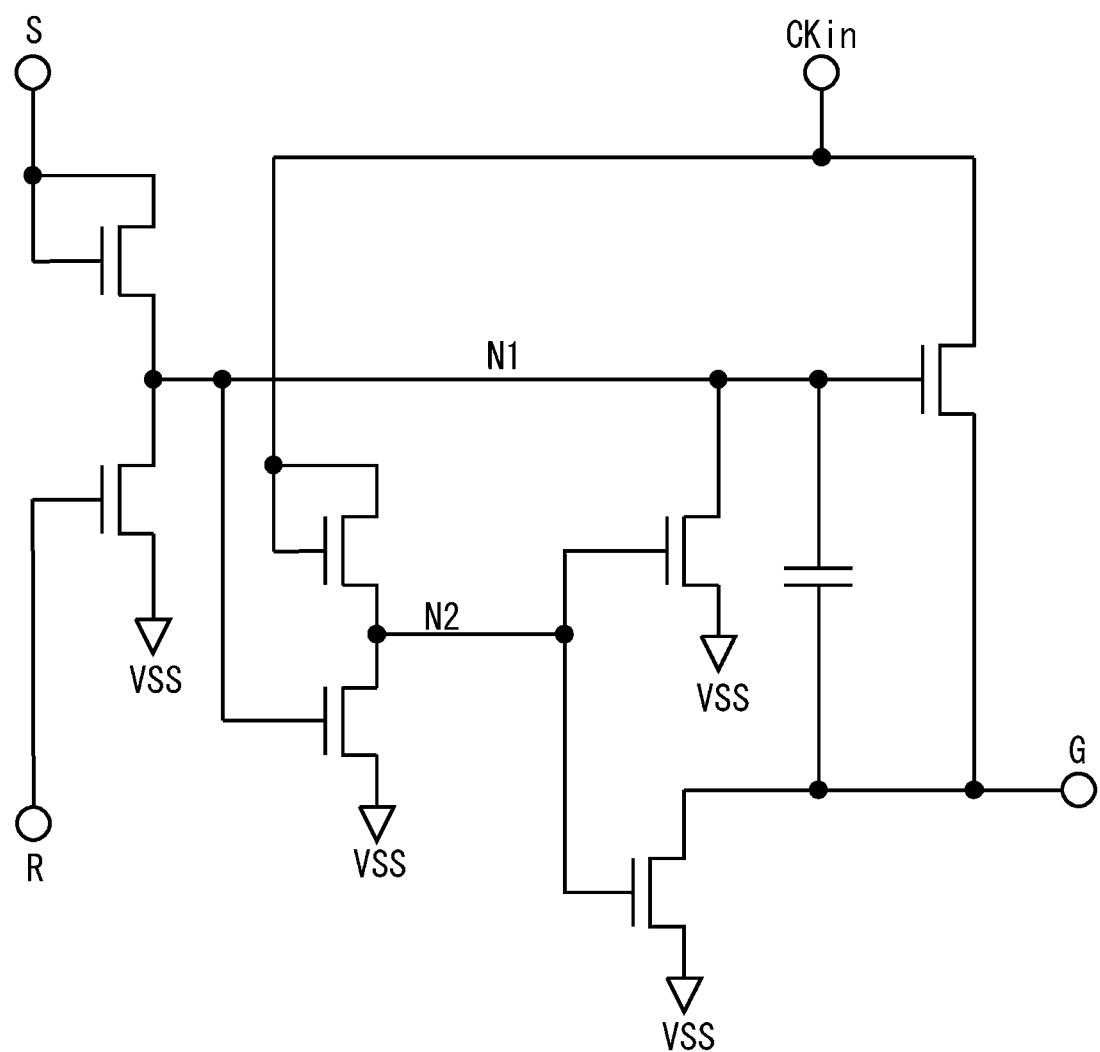
FIG. 34 is a circuit diagram illustrating a configuration example of a unit circuit of related art.
Figure 35:
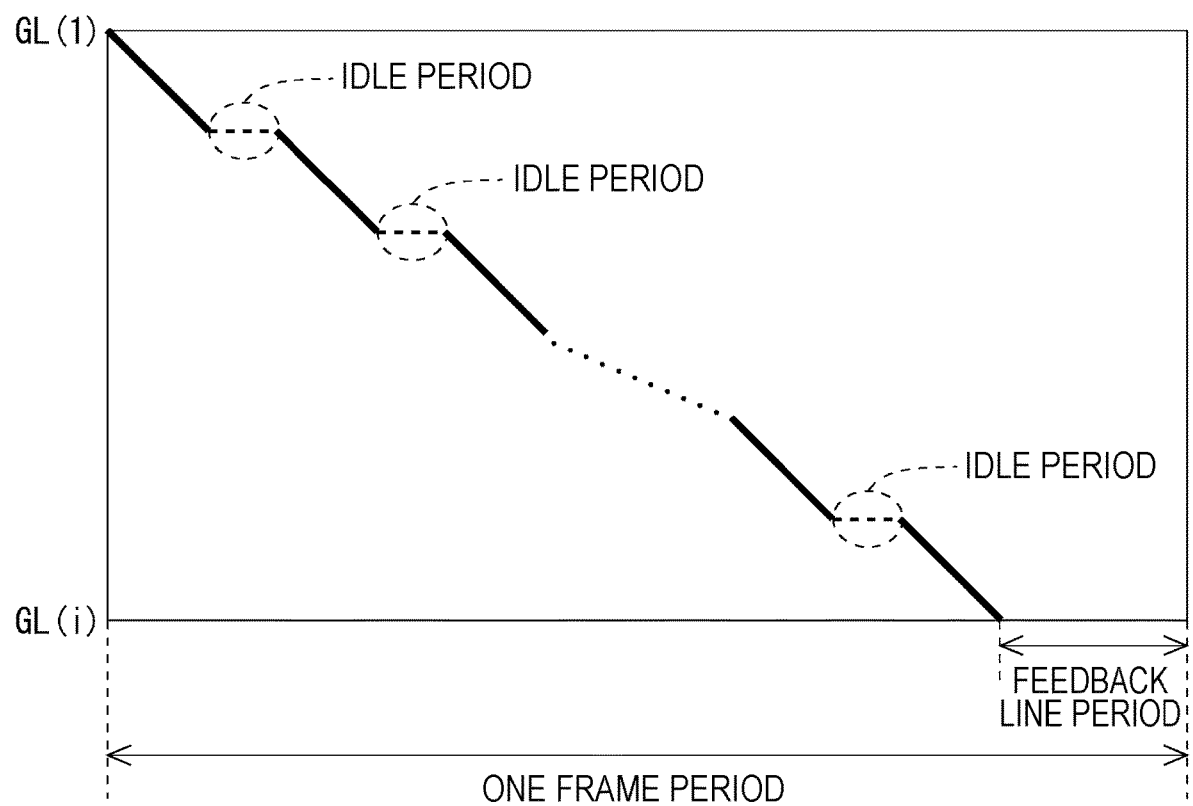
FIG. 35 is a diagram illustrating that an idle period has to be provided a plurality of times in one frame period in a liquid crystal display device including a full in-cell type touch panel.

FIG. 33 is a block diagram illustrating a schematic configuration of the gate driver 200 according to the present embodiment. The gate driver 200 according to the present embodiment is configured with the shift register 210 disposed on one end side of the display unit 400. The shift register 210 is configured with p unit circuits 2(1) to 2(i). The respective unit circuits 2 are connected to one gate bus line GL.

As understood from FIGS. 28 and 33, in the fifth embodiment, the respective gate bus lines GL (1) to GL(i) are driven by both one end side and the other end side, and in contrast to this, in the present embodiment, the respective gate bus lines GL(1) to GL(i) are driven by only one end side. Since only this point differs between the fifth embodiment and the present embodiment, description on the configuration of the shift register, configuration on the unit circuit, and an operation of the gate driver will be omitted.

Also in the present embodiment, the gate length of the thin film transistor T6 of the charge holding node turn-off transistors provided in the unit circuit 2 (see FIG. 23) is made larger than the gate lengths of other charge holding node turn-off transistors, as a countermeasure against a leakage of charges.

As described above, also in the present embodiment, the gate driver 200 capable of halting scanning-halfway while suppressing expansion of a frame size is realized in the same manner as in the first embodiment. In the same manner as in the third embodiment, the shift register 210 is provided only on one end side of the display unit 400, and thus, the frame size may be reduced.

7. Others

In the respective embodiments described above, a liquid crystal display device is described as an example, and the present disclosure is not limited thereto. The present disclosure may also be applied to other display devices such as an organic electroluminescence (EL). In the respective embodiments described above, an example in which an n-channel type thin film transistor is used for a thin film transistor in the unit circuit 2 is described, and the present disclosure is not limited thereto. The present disclosure may also be applied to a case where a p-channel thin film transistor is used for the thin film transistor in the unit circuit 2. The detailed configuration of the unit circuit 2 is not also limited to the configuration described in the respective embodiments (including modification examples) described above.

The present disclosure contains subject matter related to that disclosed in Japanese Priority Patent Application JP 2017-219625 filed in the Japan Patent Office on Nov. 15, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A scan signal line driving circuit for driving a plurality of scan signal lines that are arranged on a display unit of a display device including a touch panel, comprising:
 a shift register that operates in response to a plurality of clock signals and includes a plurality of unit circuits, each including a plurality of transistors and being connected to a corresponding scan signal line,
 wherein clock operations of the plurality of clock signals are halted during an idle period that is provided in a frame period so as to detect a touched position on the touch panel,
 wherein each unit circuit includes
 a charge holding node that holds charges to output a scan signal of an on level to the corresponding scan signal line;
 an output control transistor having a gate terminal that is connected to the charge holding node and a source terminal that is connected to the corresponding scan signal line; and
 a plurality of charge holding node turn-off transistors that change a potential of the charge holding node towards an off level, in response to a potential of a gate terminal,
 wherein the plurality of charge holding node turn-off transistors include a first stabilization transistor having a gate terminal to which a clear signal that goes to an on level at a time of an end of the frame period is applied, a drain terminal that is connected to the charge holding node, and a source terminal to which a potential of an off level is applied,
 wherein a gate length of the first stabilization transistor is larger than gate lengths of transistors other than the first stabilization transistor among the plurality of charge holding node turn-off transistors that are included in each unit circuit, and
 wherein, in a period in which a drive signal for detecting the touched position is applied to a common electrode that is provided in the display unit in the idle period, a waveform of the clear signal and a waveform of a voltage signal supplying the potential of the off level change to be the same as a waveform of the drive signal for detecting the touched position.

2. The scan signal line driving circuit according to claim 1,
 wherein the plurality of charge holding node turn-off transistors include a second stabilization transistor having a gate terminal to which a scan signal that is output from a succeeding unit circuit is applied, a drain terminal that is connected to the charge holding node, and a source terminal to which the potential of the off level is applied, and
 wherein the gate length of the first stabilization transistor is larger than a gate length of the second stabilization transistor.

3. The scan signal line driving circuit according to claim 1,
 wherein the plurality of charge holding node turn-off transistors include a third stabilization transistor having a gate terminal that is connected to a stabilization node which is controlled such that a potential goes to an on level when the potential of the charge holding node is in an off level, a drain terminal that is connected to the charge holding node, and a source terminal to which the potential of the off level is applied, and
 wherein the gate length of the first stabilization transistor is larger than a gate length of the third stabilization transistor.

4. The scan signal line driving circuit according to claim 1,
wherein one of the plurality of clock signals is applied to a drain terminal of the output control transistor.

5. The scan signal line driving circuit according to claim 1,
wherein the idle period is provided in a plurality of times in one frame period.

6. The scan signal line driving circuit according to claim 1,
wherein channel layers of the plurality of transistors are formed by using an oxide semiconductor.

* * * * *